United States Patent
Asai et al.

(10) Patent No.: US 11,437,549 B2
(45) Date of Patent: Sep. 6, 2022

(54) LIGHT EMITTING DEVICE

(71) Applicant: NICHIA CORPORATION, Anan (JP)

(72) Inventors: Kenji Asai, Naruto (JP); Kazushige Fujio, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/953,649

(22) Filed: Nov. 20, 2020

(65) Prior Publication Data
US 2021/0074891 A1 Mar. 11, 2021

Related U.S. Application Data

(63) Continuation of application No. 16/424,898, filed on May 29, 2019, now Pat. No. 10,879,429.

(30) Foreign Application Priority Data

May 29, 2018 (JP) .............................. JP2018-102654
Jun. 7, 2018 (JP) .............................. JP2018-109773

(51) Int. Cl.
*H01L 33/50* (2010.01)

(52) U.S. Cl.
CPC ............ *H01L 33/504* (2013.01); *H01L 33/50* (2013.01)

(58) Field of Classification Search
CPC combination set(s) only.
See application file for complete search history.

(56) References Cited

U.S. PATENT DOCUMENTS

| | | |
|---|---|---|
| 8,773,009 B2 | 7/2014 | Aoki et al. |
| 2013/0169146 A1* | 7/2013 | Aoki ........................ H01L 33/44 313/498 |

(Continued)

FOREIGN PATENT DOCUMENTS

| | | |
|---|---|---|
| EP | 2892306 A1 | 7/2015 |
| JP | 2013-026046 A | 2/2013 |

(Continued)

*Primary Examiner* — Moin M Rahman
(74) *Attorney, Agent, or Firm* — Hunton Andrews Kurth LLP

(57) ABSTRACT

A light emitting device includes: a light emitting element having an emission peak wavelength in a range of 430 nm to 470 nm; and a fluorescent member including a fluorescent material that is excited by light from the light emitting element for light emission, wherein a mixture of light from the light emitting element and light from the fluorescent material has a correlated color temperature in a range of 1500 K to 11000 K, as measured according to JIS Z8725, the color deviation $d_{uv}$ that is a deviation from the black body radiation track on the CIE1931 chromaticity diagram of the mixture of light and is measured according to JIS Z8725 falls within a range of more than 0 to 0.02 or less at a correlated color temperature of 1500 K to 11000 K, and when a value calculated by integrating a product of the spectral distribution of the mixture of light and each relative intensity of a human standard spectral luminous efficiency over a wavelength range of a human visible region is referred to as an integral value a and when a value calculated by integrating a product of the spectral distribution of the mixture of light and each relative intensity of an insect spectral luminous efficiency over a wavelength range where insects exhibit positive phototaxis is referred to as an integral value b, the insect attracting index I defined as a ratio of the integral value b to the integral value a (b/a) is 50% or more and 99% or less of the insect attracting index $I_0$ at the time when the color deviation $d_{uv}$ is 0.

9 Claims, 12 Drawing Sheets

Chromaticity Diagram CIE1931

(56) References Cited

U.S. PATENT DOCUMENTS

| | | | |
|---|---|---|---|
| 2013/0241394 A1* | 9/2013 | Nakagawa | C09K 11/7734 |
| | | | 313/503 |
| 2016/0090528 A1 | 3/2016 | Yoshida et al. | |
| 2016/0312118 A1* | 10/2016 | Fiedler | C09K 11/0883 |
| 2017/0054059 A1* | 2/2017 | Hosokawa | H01L 33/504 |
| 2017/0058197 A1* | 3/2017 | Nishimata | H01L 33/504 |
| 2019/0371972 A1 | 12/2019 | Asai et al. | |

FOREIGN PATENT DOCUMENTS

| JP | 2013-127928 A | 6/2013 |
|---|---|---|
| WO | 2014034228 A1 | 3/2014 |

* cited by examiner

LIGHT EMITTING DEVICE

CROSS-REFERENCE TO RELATED PATENT APPLICATION

This is a continuation application of U.S. patent application Ser. No. 16/424,898, filed May 29, 2019, which claims priority to Japanese Patent Application No. 2018-102654, filed on May 29, 2018, and Japanese Patent Application No. 2018-109773, filed on Jun. 7, 2018, the entire disclosures of which are incorporated herein by references in their entirety.

BACKGROUND

Technical Field

The present invention relates to a light emitting device.

Description of Related Art

As a light emitting device using a light emitting element such as a light emitting diode (hereinafter referred to as "LED"), there is known a light emitting device using a blue light emitting element and a fluorescent material that is excited by the light from the light emitting element for yellow emission, thereby emitting a white-based mixed light. Such a light emitting device is used in a wide variety of fields of general illumination devices, in-vehicle lightings, displays, backlights for liquid-crystal devices, etc.

Many insects are attracted to light emitted from illumination devices using a light emitting device. Insects are attracted to light, which is because of the positive phototaxis of insects, and is a behavior attributable to the spectral sensitivity differing between the species of insects. In general, insects have two spectral sensitivities each in a range before and after a wavelength of around 400 nm, that is, one in a wavelength range of about 300 nm to about 400 nm and the other in a wavelength range of about 400 nm to about 600 nm.

As a bug-proof light source that prevents an effect of attracting insects (hereinafter in this description, this may be referred to as "insect attracting effect"), there is known a light source that emits light where wavelengths of spectral sensitivity for insects have been cut off. For example, there are known a light source that emits a yellow monochromatic light where light at a wavelength of about 450 nm or less has been cut off, and a light source that emits a red monochromatic light where light at a wavelength of about 600 nm or less has been cut. Such a monochromatic light source is known to have a certain effect for reducing the insect attracting effect that attracts insects depending on the kind of insects (hereinafter in this description, this may be referred to as "insect attraction depressing effect"). A monochromatic light source is effective for use for night-time lighting in agriculture. However, in human visual environments such as in industrial workplaces or in daily life, a light source that emits a yellow monochromatic light or a red monochromatic light may be often uncomfortable as the case may be.

Differing from an ordinary fluorescent lamp, a light emitting device using LED may be so designed as not to emit UV light, and is therefore known to have an insect attraction depressing effect as compared with a fluorescent lamp. However, the light emitted from the light emitting device using LED includes a blue light wavelength region in which insects have a spectral sensitivity, and it is desired to further enhance the insect attraction depressing effect of the light emitting device using LED. Consequently, using an LED chip (light emitting element), a fluorescent material that is excited by the light from the LED chip for light emission, and a distributed Bragg reflector for blocking penetration of light at a predetermined wavelength, a light emitting device that controls the energy intensity in a wavelength region for the spectral sensitivity of insects has been proposed. For example, Japanese Unexamined Patent Publication No. 2013-26046 and Japanese Unexamined Patent Publication No. 2013-127928 discloses the light emitting device.

In the case of using a distributed Bragg reflector for lowering the transmittance of light in a specific wavelength region, theoretically the transmittance of light in a specific wavelength region could be lowered through the distributed Bragg reflector only in the spectral distribution of light that penetrates vertically to the distributed Bragg reflector. The distributed Bragg reflector provides light interference at the interface between the layers differing in the refractive index therein, and therefore has incident angle dependence. For example, the spectral distribution of light falling on a distributed Bragg reflector at an incident angle thereto, that is, the spectral distribution of light oblique to the distributed Bragg reflector could hardly receive the effect of the distributed Bragg reflector, and in such a case, the insect attraction depressing effect could not be attained. The light emitting devices disclosed in Japanese Unexamined Patent Publication No. 2013-26046 and Japanese Unexamined Patent Publication No. 2013-127928, even though not using a distributed Bragg reflector, have a first peak wavelength in a range of 380 nm to 470 nm and a second peak wavelength in a range of 500 nm to 700 nm in the spectral distribution of the light emitting devices, but have a wavelength region having a lower relative energy intensity than the first peak wavelength and the second peak wavelength in a range of 470 nm to 500 nm. Since the light emitting components in this wavelength region are insufficient, the light emitting devices disclosed in Japanese Unexamined Patent Publication No. 2013-26046 and Japanese Unexamined Patent Publication No. 2013-127928 have a risk that the color rendering property thereof in human visual environments would be insufficient.

Given the situation, an embodiment of the present disclosure is to provide a light emitting device capable of enhancing the insect attraction depressing effect and having a sufficient color rendering property in human visual environments.

SUMMARY

The present disclosure includes the following embodiments.

A light emitting device including: a light emitting element having an emission peak wavelength in a range of 430 nm to 470 nm; and a fluorescent member including a fluorescent material that is excited by light from the light emitting element for light emission, wherein a mixture of light from the light emitting element and light from the fluorescent material has a correlated color temperature in a range of 1500 K to 11000 K, as measured according to JIS Z8725, the color deviation $d_{uv}$ that is a deviation from the black body radiation track on the CIE1931 chromaticity diagram of the mixture of light and is measured according to JIS Z8725 falls within a range of more than 0 to 0.02 or less at a correlated color temperature of 1500 K to 11000 K, and when a value calculated by integrating a product of the spectral distribution of the mixture of light and each relative intensity of a human standard spectral luminous efficiency over a wavelength range of a human visible region is referred to as an integral value a and when a value calculated by integrating a product of the spectral distribution of the mixture of light and each relative intensity of an insect spectral luminous efficiency over a wavelength range where insects exhibit positive phototaxis is referred to as an integral value b, the insect attracting index I defined as a ratio of the integral value b to the integral value a (b/a) is 50% or more and 99% or less of the insect attracting index $I_0$ of a reference light emitting device where the color deviation $d_{uv}$ is 0. The human standard spectral luminous efficiency refers to the CIE standard spectral luminous efficiency of photopic vison and/or dark vision as defined in JIS Z8785:2019.

According to the present disclosure, there can be provided a light emitting device having a higher insect attraction depressing effect and having a sufficient color rendering property in human visual environments.

DETAILED DESCRIPTION

Hereinunder the light emitting device of the present disclosure is described on the basis of an embodiment thereof. The embodiments described below is an exemplification for embodying the technical idea of the present disclosure, and the present disclosure is not limited to the light emitting device described below. The relationship between the color name and the chromaticity coordinate, and the relationship between the wavelength range of light and the name of monochromatic light are in accordance with JIS Z8110.

The light emitting device of an embodiment of the present disclosure is provided with a light emitting element having an emission peak wavelength in a range of 430 nm to 470 nm, and a fluorescent member including a fluorescent material that is excited by the light from the light emitting element for light emission, wherein the correlated color temperature (hereinafter this may be referred to as "Tcp"), as measured according to JIS Z8725, of a mixture of light from the light emitting element and light from the fluorescent material falls within a range of 1500 K to 11000 K, the color deviation $d_{uv}$ that is a deviation from the black body radiation track on the CIE (Commission Internationale de l' Eclairage) 1931 chromaticity diagram of the mixture of light and is measured according to JIS Z8725 falls within a range of more than 0 to 0.02 or less at a correlated color temperature of 1500 K or more and 11000 K or less, and when a value calculated by integrating a product of the spectral distribution of the mixture of light and each relative intensity of a human standard spectral luminous efficiency over a wavelength range of a human visible region is referred to as an integral value a and when a value calculated by integrating a product of the spectral distribution of the mixture of light and each relative intensity of an insect spectral luminous efficiency over a wavelength range where insects exhibit positive phototaxis is referred to as an integral value b, the insect attracting index I defined as a ratio of the integral value b to the integral value a (b/a) is 50% or more and 99% or less of the insect attracting index $I_0$ of a reference light emitting device where the color deviation $d_{uv}$ is 0.

Figure 1:
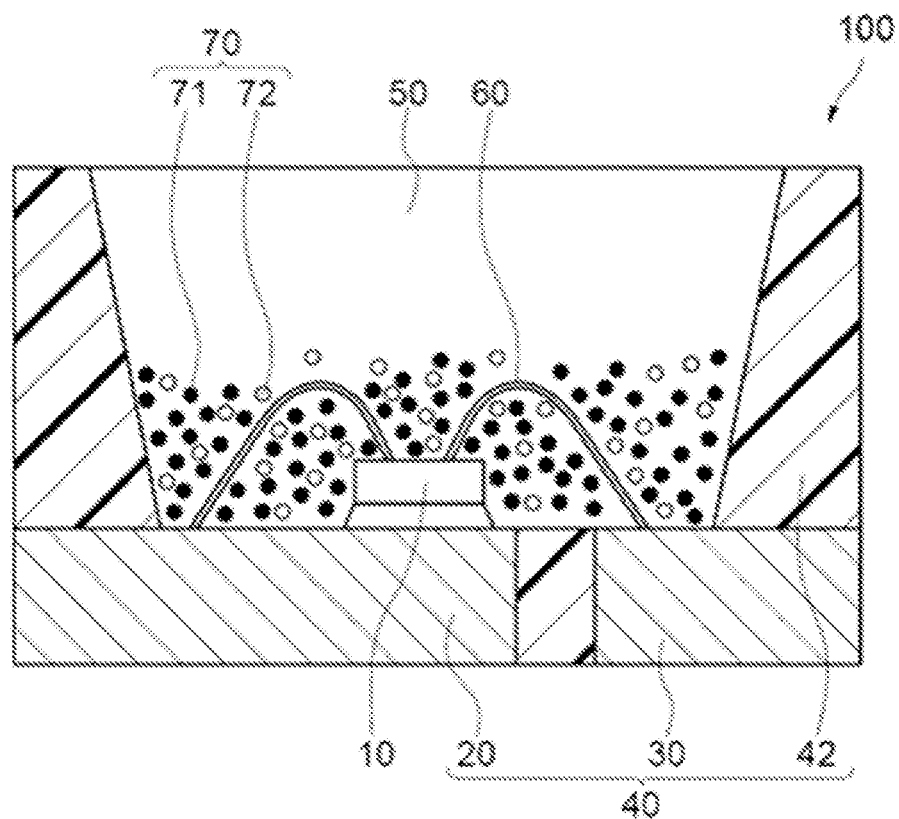
FIG. 1 is a schematic cross-sectional view showing an example of a light emitting device according to the present disclosure.

One example of the light emitting device of an embodiment of the present disclosure is described with reference to the drawings. FIG. 1 is a schematic cross-sectional view showing a light emitting device 100 of an embodiment of the present disclosure.

As shown in FIG. 1, the light emitting device 100 is provided with a light emitting element 10 having an emission peak wavelength within a range of 430 nm to 470 nm, and a fluorescent member 50 including a fluorescent material 70 that is excited by the light from the light emitting element for light emission.

The light emitting device 100 is, for example, provided with a molded body 40, the light emitting element 10 and the fluorescent member 50. The molded body 40 is formed of a first lead 20, a second lead 30 and a resin part 42 containing a thermoplastic resin or a thermosetting resin that are integrally molded. The molded body 40 forms a concave portion having a bottom and a side wall, in which the light emitting element 10 is mounted on the bottom of the concave portion. The light emitting element 10 has a pair of positive and negative electrodes, and the pair of positive and negative electrodes each are electrically connected to the first lead 20 and the second lead 30, respectively, via a wire 60. The light emitting element 10 is covered by the fluorescent member 50. The fluorescent member 50 includes, for example, a fluorescent material 70 that undergoes wavelength conversion of the light from the light emitting element 10, and a sealing material. The fluorescent material 70 has at least one emission peak wavelength in a specific wavelength range, as excited by the light from the light emitting element, and may include two or more kinds of fluorescent materials differing in the wavelength range of the emission peak wavelength thereof. The fluorescent material 70 preferably includes a first fluorescent material 71 having at least one emission peak wavelength in a range of 530 nm to 580 nm, as excited by the light from the light emitting element. Also preferably, the fluorescent material 70 further contains a second fluorescent material 72 having at least one emission peak wavelength in a range of 600 nm to 670 nm, as excited by the light from the light emitting element. The first lead 20 and the second lead 30 electrically connected to the pair of positive and negative electrodes of the light emitting element 10 are partly exposed out toward the outside of the package constituting the light emitting device 100. Via these first lead 20 and second lead 30, the light emitting device 100 receives external power supply for light emission.

The light emitting element 10 is used as an excitation light source. In an embodiment of the present disclosure, the light emitting element 10 has an emission peak wavelength within a range of 430 nm to 470 nm. The light emitting element 10 does not have an emission peak wavelength in a wavelength range of about 300 nm to about 400 nm on the short wavelength side in an insect spectral luminous efficiency curve, and hardly attracts insects of the kind that are attracted to the light falling within a wavelength range of about 300 nm to about 400 nm, and the light emitting device using the light emitting element has an insect attraction depressing effect. The full width at half maximum of the emission spectrum of the light emitting element 10 may be, for example, 30 nm or less, may be 25 nm or less, and may be 20 nm or less. The full width at half maximum (FWHM) means a wavelength width of an emission peak that indicates a value of 50% of the maximum value of a emission peak in a emission spectrum. The light emitting element 10 is, for example, preferably a semiconductor light emitting element using a nitride-based semiconductor ($In_xAl_yGa_{1-X-Y}N$, $0 \leq X$, $0 \leq Y$, $X+Y \leq 1$). Using a semiconductor light emitting element as the light emitting element, a stable light emitting device having high efficiency, high linearity relative to input and resistance to mechanical impacts can be obtained. A light emitting element having an emission peak wavelength in a range of less than 430 nm realizes high intensity of light that overlaps with an insect spectral luminous efficiency curve, and the effect of attracting insects (insect attracting effect) thereof is high. A light emitting element having an emission peak wavelength in a range more than 470 nm emits light having a targeted correlated color temperature, and the amount of the fluorescent material to be contained in the fluorescent member may be small. Consequently, the blue light emitted from the light emitting element would pass through the light emitting device not undergoing sufficient wavelength conversion by the action of the fluorescent material and, in such a case, the insect attracting effect of the device may rather increase. In a light emitting device using a light emitting element that has an emission peak wavelength in a range more than 470 nm, the blue light emitted from the light emitting element may also pass through the device not undergoing sufficient wavelength conversion by the action of the fluorescent material therein and therefore, in such a case the color rendering property of the device may decrease.

The light emitting device of an embodiment of the present disclosure is such that the color deviation $d_{uv}$ that is a deviation from the black body radiation track of the mixed light from the light emitting device at a correlated color temperature of 1500 K or more and 11000 K or less falls within a range of more than 0 to 0.02 or less, and more preferably $d_{uv}$ is 0.01 or more and 0.02 or less. When the color deviation $d_{uv}$ that is a deviation from the black body radiation track of the mixed light from the light emitting device and is measured according to JIS Z8725 falls within a range of more than 0 to 0.02 or less, a green component to a yellow component or an orange component on the CIE1931 chromaticity diagram may tend to increase, and on the contrary, a blue component and a red component may tend to decrease. On the other hand, when the color deviation $d_{uv}$ of the mixed light from the light emitting device is 0 or less and with the increase in the minus numerical value of the color deviation $d_{uv}$, a blue component and/or a red component may tend to increase. The light emitting device of an embodiment of the present disclosure is such that the color deviation $d_{uv}$ of the mixed light from the light emitting device falls within a range of more than 0 to 0.02 or less, and in the mixed light, light of a blue component on the short wavelength side of about 300 nm to 400 nm that overlaps with an insect spectral luminous efficiency curve decreases and light of a red component on the long wavelength side of about 400 nm to 600 nm that overlaps with an insect spectral luminous efficiency curve decreases, and the light emitting device can have an insect attraction depressing effect.

Figure 2:
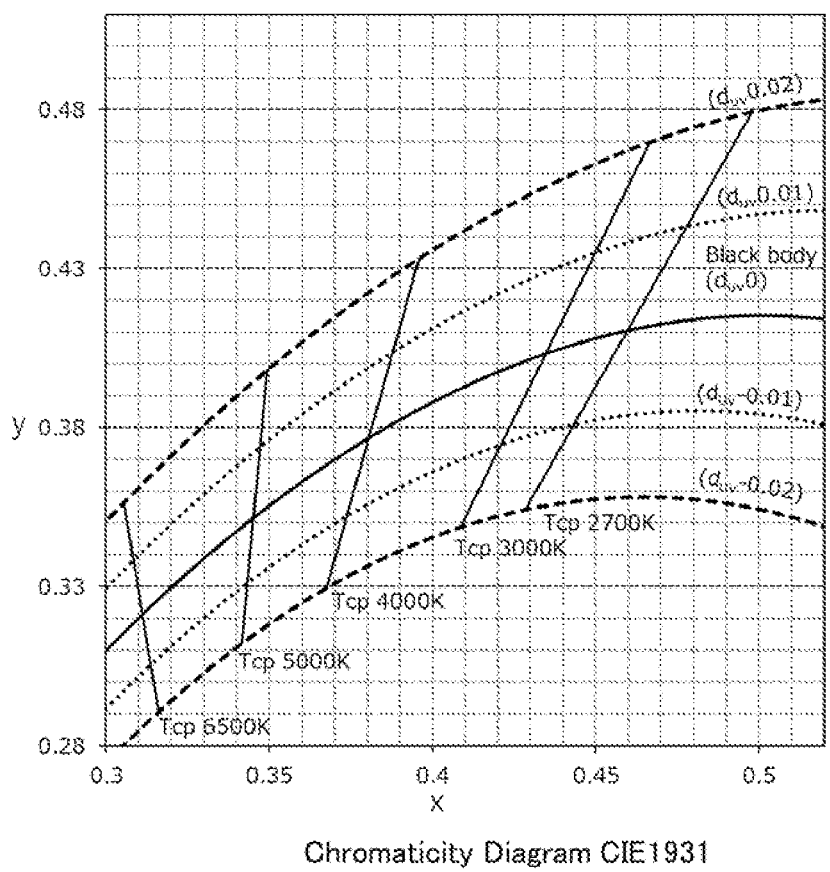
FIG. 2 is a graph showing a part of a CIE1931 chromaticity diagram, and shows a black body radiation track ($d_{uv}$0) on the CIE1931 chromaticity diagram and the tracks of the color deviation $d_{uv}$–0.02, $d_{uv}$–0.01, $d_{uv}$0.01, and $d_{uv}$0.02 from the black body radiation track at each correlated color temperature.

FIG. 2 is a graph showing a part of a CIE1931 chromaticity diagram, and shows a black body radiation track $(d_{uv}0)$ on the CIE1931 chromaticity diagram and the tracks of the color deviation $d_{uv}$–0.02, $d_{uv}$–0.01, $d_{uv}$0.01, and $d_{uv}$0.02 from the black body radiation track at each correlated color temperature. In FIG. 2, the straight lines that cross the black body radiation track $(d_{uv}0)$ each are an isotemperature line at each correlated color temperature (Tcp of 2700K, 3000K, 4000K, 5000K, or 6500K), respectively. When the color deviation $d_{uv}$ that is a deviation from the black body radiation track of the mixed light from the light emitting device at a correlated color temperature of 1500 K or more and 11000 K or less and is measured according to JIS Z8725 is a numerical value smaller than 0, a blue component and/or a red component contained in the mixed light may tend to increase to readily attract insects increasing an insect attracting effect. In the case where the color deviation $d_{uv}$ of the mixed light from the light emitting device is 0, this means that the mixed light has no deviation from the black body radiation track, and the black body radiation track is approximate to that at a predetermined correlated color temperature. When the color deviation $d_{uv}$ of the mixed light from the light emitting device in a correlated color temperature range of 1500 K to 11000 K is more than 0.02, a green to yellow component or an orange component in the mixed light may be too much to keep a balance of white light, therefore often worsening the color rendering property of the light emitting device.

The light emitting device of an embodiment of the present disclosure is such that, when a value calculated by integrating a product of the spectral distribution of the mixed light from the light emitting device and each relative intensity of a human standard spectral luminous efficiency over a wavelength range of a human visible region is referred to as an integral value a and when a value calculated by integrating a product of the spectral distribution of the mixed light and each relative intensity of an insect spectral luminous efficiency over a wavelength range where insects exhibit positive phototaxis is referred to as an integral value b, the insect attracting index I defined as a ratio of the integral value b to the integral value a (b/a) is 50% or more and 99% or less of the insect attracting index $I_0$ where the color deviation $d_{uv}$ is 0. Relative to the insect attracting index $I_0$ of 100% of a reference light emitting device having a color deviation $d_{uv}$ of 0, the insect attracting index I of the light emitting device of an embodiment of the present disclosure is 50% or more and 99% or less and is smaller than the former, that is, the light emitting device of an embodiment of the present disclosure hardly attracts insects and has an insect attraction depressing effect. When the insect attracting index I of the light emitting device of an embodiment of the present disclosure is more than 99% relative to the insect attracting index $I_0$ of the reference light emitting device having a color deviation $d_{uv}$ of 0, the insect attracting effect is almost the same as that of the light emitting device having a color deviation $d_{uv}$ of 0, that is, the light emitting device of an embodiment of the present disclosure could no more have an insect attraction depressing effect. When the insect attracting index I of the light emitting device of an embodiment of the present disclosure is less than 50% relative to the insect attracting index $I_0$ of the reference light emitting device having a color deviation $d_{uv}$ of 0, the insect attraction depressing effect thereof could increase but the mixed light from the light emitting device may lose color balance to worsen the color rendering property thereof. The ratio (%) of the insect attracting index I of the light emitting device of an embodiment of the present disclosure relative to the insect attracting index $I_0$ of the reference light emitting device having a color deviation $d_{uv}$ of 0 is expressed by a value calculated by dividing the insect attracting index I by the insect attracting index $I_0$ followed by multiplying it by 100 ($I/I_0 \times 100(\%)$). In this description, the insect attracting index I of the light emitting device relative to the insect attracting index $I_0$ 100% of the reference light emitting device having a color deviation $d_{uv}$ of 0 may be referred to as a relative insect attracting index ($I/I_0$) (%).

The wavelength range of a human visible range is 380 nm to 780 nm. The wavelength range where insects exhibit positive phototaxis varies depending on the kind of insects, and two wavelength ranges are known, one is a wavelength range of 250 nm to 580 nm (Bickford) and the other is a wavelength range of 250 nm to 615 nm (Bertholf). A value calculated by integrating a product of the spectral distribution of the mixed light from the light emitting device and each relative intensity of a human standard spectral luminous efficiency over a wavelength range of a human visible region, that is, an integral value a may be expressed by the following expression (a-1).

$$a = \int_{380}^{780} P(\lambda)V(\lambda)d\lambda \tag{a-1}$$

In the expression (a-1), a is an integral value, $P(\lambda)$ is a spectral distribution intensity relative to the wavelength of the mixed light from the light emitting device, and $V(\lambda)$ is a wavelength-related human standard spectral luminous efficiency.

A value calculated by integrating a product of the spectral distribution of the mixed light from the light emitting device and each relative intensity of an insect spectral luminous efficiency over a wavelength range where insects exhibit positive phototaxis, that is, an integral value b may be expressed by the following expression (b-1) or the following expression (b-2), for which the wavelength range where insects exhibit positive phototaxis varies depending on the kind of insects.

$$b = \int_{250}^{580} P(\lambda)S(\lambda)d\lambda \tag{b-1}$$

$$b = \int_{250}^{615} P(\lambda)S(\lambda)d\lambda \tag{b-2}$$

In the expression (b-1) or the expression (b-2), b is an integral value, $P(\lambda)$ is a spectral distribution intensity relative to the wavelength of the mixed light from the light emitting device, and $S(\lambda)$ is a wavelength-related insect spectral luminous efficiency.

The insect attracting index of the mixed light from the light emitting device of an embodiment of the present disclosure is calculated according to the following expression (1) or (2).

$$I = \frac{\int_{250}^{580} P(\lambda)S(\lambda)d\lambda}{\int_{380}^{780} P(\lambda)V(\lambda)d\lambda} \tag{1}$$

$$I = \frac{\int_{250}^{615} P(\lambda)S(\lambda)d\lambda}{\int_{380}^{780} P(\lambda)V(\lambda)d\lambda} \quad (2)$$

In the expression (1) or (2), I is an insect attracting index of the mixed light from the light emitting device, $P(\lambda)$ is a spectral distribution intensity relative to the wavelength of the mixed light from the light emitting device, $S(\lambda)$ is a wavelength-related insect spectral luminous efficiency, and $V(\lambda)$ is a wavelength-related human standard spectral luminous efficiency.

The insect attracting index $I_0$ of the reference light emitting device having a color deviation $d_{uv}$ of 0 is, when a value calculated by integrating a product of the spectral distribution relative to the wavelength of the mixed light from the reference light emitting device having a color deviation $d_{uv}$ of 0, and each relative intensity of a human standard spectral luminous efficiency over a wavelength range of a human visible region is referred to as an integral value $a_0$ and when a value calculated by integrating a product of the spectral distribution of the mixed light and each relative intensity of an insect spectral luminous efficiency over a wavelength range where insects exhibit positive phototaxis is referred to as an integral value $b_0$, expressed as a ratio of the integral value $b_0$ to the integral value $a_0$ ($b_0/a_0$). Specifically, with reference to the above-mentioned expressions (a-1), (b-1), (b-2), (1) and (2), the insect attracting index $I_0$ can be calculated from the spectral distribution intensity $P_0(\lambda)$ relative to the wavelength of the mixed light from the reference light emitting device having a color deviation $d_{uv}$ of 0. Specifically, the insect attracting index $I_0$ of the reference light emitting device having a color deviation $d_{uv}$ of 0 is calculated from the following expression (3) or (4).

$$I_0 = \frac{\int_{250}^{580} P_0(\lambda)S(\lambda)d\lambda}{\int_{380}^{780} P_0(\lambda)V(\lambda)d\lambda} \quad (3)$$

$$I_0 = \frac{\int_{250}^{615} P_0(\lambda)S(\lambda)d\lambda}{\int_{380}^{780} P_0(\lambda)V(\lambda)d\lambda} \quad (4)$$

In the expression (3) or (4), $I_0$ is an insect attracting index of the mixed light from the reference light emitting device having a color deviation $d_{uv}$ of 0, $P_0(\lambda)$ is a spectral distribution intensity relative to the wavelength of the mixed light from the reference light emitting device having a color deviation $d_{uv}$ of 0, $S(\lambda)$ is a wavelength-related insect spectral luminous efficiency, and $V(\lambda)$ is a wavelength-related human standard spectral luminous efficiency.

Preferably, the light emitting device of an embodiment of the present disclosure has an average color rendering index Ra of 60 or more. The average color rendering index Ra of the light emitting device is more preferably 61 or more, even more preferably 62 or more. The average color rendering index Ra of the light emitting device may be measured according to JIS Z8726. When the average color rendering index Ra of the light emitting device is nearer to 100, the color rendering property is nearer to that of a standard light source. When emission of light of a color component falling in a wavelength range that overlaps with an insect spectral luminous efficiency for the purpose of reducing the insect attracting effect is reduced, then the color balance of white light would be lost and the numerical value of the average color rendering index Ra may tend to lower. When an average color rendering index Ra near to that of a standard light source is desired to be obtained, then light of a color component falling within a wavelength range that overlaps with an insect spectral luminous efficiency curve could not be sufficiently suppressed, and if so, the effect of attracting insects (insect attracting effect) of the light emitting device could not be reduced. According to the guideline announced by CIE in 1986, the average color rendering index that a fluorescent lamp is desired to satisfy is said to be 60 or more and less than 80 in ordinary working factories. For satisfying an insect attraction depressing effect and for satisfying a sufficient color rendering property in human visual environment, the average color rendering index Ra of the light emitting device may be less than 80, or may be 78 or less.

The fluorescent material contained in the fluorescent member in the light emitting device of an embodiment of the present disclosure preferably includes a first fluorescent material. The first fluorescent material has at least one emission peak wavelength in a range of 530 nm or more to 580 nm or less, as excited by the light from the light emitting element. The first fluorescent material preferably contains at least one fluorescent material selected from the group consisting of (1a) a rare earth aluminate fluorescent material activated with Ce, (1b) a rare earth silicon nitride fluorescent material activated with Ce, (1c) a scandate fluorescent material activated with Ce, (1d) a scandium silicate fluorescent material activated with Ce, (1e) an alkaline earth metal aluminate fluorescent material activated with Eu, and (1f) a silicate fluorescent material containing Ca, Mg and Cl in the composition and activated with Eu.

The rare earth aluminate fluorescent material activated with Ce of (1a) includes a fluorescent material containing a composition represented by the following formula (I).

(Lu,Y,Gd,Tb)$_3$(Al,Ga)$_5$O$_{12}$:Ce    (I)

Examples of the rare earth aluminate fluorescent material activated with Ce of (1a) include fluorescent materials containing a composition represented by Y$_3$Al$_5$O$_{12}$:Ce, (Y$_{0.8}$Gd$_{0.2}$)$_3$Al$_5$O$_{12}$:Ce, Y$_3$(Al$_{0.8}$Ga$_{0.2}$)$_5$O$_{12}$:Ce, (Y,Gd)$_3$(Al,Ga)$_5$O$_{12}$:Ce, Tb$_3$Al$_5$O$_{12}$:Ce, and Lu$_3$Al$_5$O$_{12}$:Ce. In this description, in the formulae representing the compositions of the fluorescent materials, plural elements sectioned by the comma (,) mean that at least one element of these plural elements is contained in the composition. The plural elements sectioned by the comma (,) in the compositional formulae mean that at least one element selected from the plural elements thus sectioned by the comma is contained in the composition and two or more kinds of the plural elements may be contained therein in combination. In this description, in the formulae representing the compositions of the fluorescent materials, the part before the colon (:) represents a host crystal and the part after the colon (:) represents an activating element.

The Ce-activated rare earth silicon nitride fluorescent material of the above (1b) includes a fluorescent material containing a composition represented by the following formula (II).

(La,Cd,Y)$_3$(Al,Si)$_6$N$_{11}$:Ce    (II)

The Ce-activated scandate fluorescent material of the above (1c) includes a fluorescent material containing a composition represented by the following formula (III).

CaSc$_2$O$_4$:Ce    (III)

The Ce-activated scandium silicate fluorescent material of the above (1d) includes a fluorescent material containing a composition represented by the following formula (IV).

$$Ca_3Sc_2Si_3O_{12}:Ce \qquad (IV)$$

The Eu-activated alkaline earth metal aluminate fluorescent material of the above (1e) includes a fluorescent material containing a composition represented by the following formula (V).

$$(Sr,Ca,Ba)_4Al_{14}O_{25}:Eu \qquad (V)$$

The Eu-activated alkaline earth metal aluminate fluorescent material of the above (1e) includes fluorescent materials containing a composition represented by $SrAl_2O_4$:R, $Sr_4Al_{14}O_{25}$:R, $CaAl_2O_4$:R, $BaMg_2Al_{16}O_{27}$:R, $BaMg_2Al_{16}O_{12}$:R, and $BaMgAl_{10}O_{17}$:R (where R is any one or more of Eu-activated, Mn-activated, Eu and Mn-activated).

The Eu-activated silicate fluorescent material containing Ca, Mg and Cl in the composition thereof of the above (1f) includes a fluorescent material containing a composition represented by the following formula (VI).

$$(Ca,Sr,Ba)_8MgSi_4O_{16}(F,Cl,Br)_2:Eu \qquad (VI)$$

Preferably, the fluorescent material contained in the fluorescent member in the light emitting device of an embodiment of the present disclosure further contains a second fluorescent material. The second fluorescent material has at least one emission peak wavelength in a range of 600 nm or more to 670 nm or less, as excited by the light from the light emitting element. Preferably, the second fluorescent material contains at least one fluorescent material selected from the group consisting of (2a) a silicon nitride fluorescent material containing at least one element selected from Sr and Ca, and Al in the composition and activated with Eu, (2b) an alkaline earth metal silicon nitride fluorescent material activated with Eu, (2c) a fluoride fluorescent material containing at least one selected from the group consisting of K, Li, Na, Rb, Cs and $NH_4^+$, and at least one element selected from the group consisting of a Group 4 element and a Group 14 element in the composition and activated with Mn, and (2d) a fluorogermanate fluorescent material activated with Mn.

The silicon nitride fluorescent material containing at least one element selected from Sr and Ca, and Al in the composition and activated with Eu of the above (2a) includes a fluorescent material containing a composition represented by the following formula (i).

$$(Ca_{1-s-t}Sr_sEu_t)_xAl_uSi_vN_w \qquad (i)$$

In the formula (i), s, t, u, v, w and x each represent a number satisfying $0 \le s \le 1.0$, $0 < t < 1.0$, $0 < s+t < 1.0$, $0.8 \le x \le 1.0$, $0.8 \le u \le 1.2$, $0.8 \le v \le 1.2$, $1.9 \le u+v \le 2.1$, and $2.5 \le w \le 3.5$. The fluorescent material containing the composition represented by the formula (i) may be expressed as a $CaAlSiN_3$:Eu fluorescent material or an $(Sr,Ca)AlSiN_3$:Eu fluorescent material. In the formula (i), the parameter t indicates the molar ratio of the activating element Eu in the composition represented by the formula (i). The parameter t is preferably $0.0001 \le t \le 0.2$, more preferably $0.0001 \le t \le 0.1$, even more preferably $0.0002 \le t \le 0.05$. In the formula (i), the parameter s indicates the molar ratio of Sr in the composition represented by the formula (i). The parameter s is preferably $0 \le s \le 0.98$, more preferably $0 \le s \le 0.95$, even more preferably $0 \le s \le 0.90$.

The alkaline earth metal silicon nitride fluorescent material activated with Eu of the above (2b) includes a fluorescent material containing a composition represented by the following formula (ii).

$$(Ca_{1-p-q-r}Sr_pBa_qEu_r)_2Si_5N_8 \qquad (ii)$$

In the formula (ii), p, q and r each represent a number satisfying $0 \le p \le 1.0$, $0 \le q \le 1.0$, $0 < r < 1.0$ and $p+q+r \le 1.0$.

The fluoride fluorescent material of the above (2c) containing at least one selected from the group consisting of K, Li, Na, Rb, Cs and $NH_4^+$, and at least one element selected from the group consisting of a Group 4 element and a Group 14 element in the composition thereof and activated with Mn includes a fluorescent material containing a composition represented by the following formula (iii).

$$A_2[M^1_{1-g}Mn^{4+}_gF_6] \qquad (iii)$$

In the formula (iii), A is at least one selected from the group consisting of K, Li, Na, Rb, Cs and $NH_4^+$, $M^1$ is at least one element selected from the group consisting of a Group 4 element and a Group 14 element, and g is a number satisfying $0 < g < 0.2$.

The fluorogermanate fluorescent material activated with Mn of the above (2d) includes a fluorescent material containing a composition represented by the following formula (iv).

$$(i-j)MgO \cdot (j/2)Sc_2O_3 \cdot kMgF_2 \cdot mCaF_2 \cdot (1-n)GeO_2 \cdot (n/2)M^3_2O_3 : zMn^{4+} \qquad (iv)$$

In the formula (iv), $M^3$ is at least one selected from the group consisting of Al, Ga and In, i, j, k, m, n and z each represent a number satisfying $2 \le i \le 4$, $0 \le j < 0.5$, $0 < k < 1.5$, $0 \le m < 1.5$, $0 < n < 0.5$, and $0 < z < 0.05$.

Preferably, the fluorescent material contained in the fluorescent member in the light emitting device of an embodiment of the present disclosure contains the first fluorescent material and the second fluorescent material, and also preferably, the first fluorescent material contains the rare earth aluminate fluorescent material activated with Ce of (1a) and the second fluorescent material contains the silicon nitride fluorescent material containing at least one element selected from Sr and Ca, and Al in the composition thereof and activated with Eu of (2a). When the fluorescent material contains the first fluorescent material containing the rare earth aluminate fluorescent material and the second fluorescent material containing the silicon nitride fluorescent material, the light emitting device of an embodiment of the present disclosure can control the mixed light from the device so as to suppress the intensity of the color component having a wavelength range that overlaps with an insect spectral luminous efficiency curve and to realize a spectral distribution where the intensity of the color component having a wavelength range that overlaps with a human standard spectral luminous efficiency is increased. When the first fluorescent material contains the rare earth aluminate fluorescent material and the second fluorescent material containing the silicon nitride fluorescent material, the mixed light from the emitting device can be so controlled that the color deviation $d_{uv}$ falls within a range of more than 0 to 0.02 or less and the insect attracting index I is 50% or more and 99% or less relative to the insect attracting index $I_0$ of 100% of a reference light emitting device where the color deviation $d_{uv}$ is 0.

In the case where the fluorescent material contained in the fluorescent member in the light emitting device of an embodiment of the present disclosure contains the first fluorescent material containing the rare earth aluminate fluorescent material activated with Ce of (1a) and where the second fluorescent material containing the silicon nitride fluorescent material containing at least one element selected from Sr and Ca, and Al in the composition thereof and activated with Eu of (2a), the mass ratio of the second fluorescent material to the first fluorescent material (second fluorescent material/first fluorescent material) is preferably within a range of 0.005 to 0.27, more preferably within a range of 0.01 to 0.25, even more preferably within a range of 0.01 to 0.20, further more preferably within a range of 0.01 to 0.18, and especially preferably within a range of 0.01 to 0.15. In the case where the fluorescent material containing the first fluorescent material containing the rare earth aluminate fluorescent material and the second fluorescent material containing the silicon nitride fluorescent material and where the mass ratio of the second fluorescent material to the first fluorescent material falls within the above range, a light emitting device having an insect attracting index I of 50% or more and 99% or less relative to the insect attracting index $I_0$, having a large insect attraction depressing effect and having a sufficient color rendering property in human visual environments can be provided, although it depends on the emission peak wavelength of the light emitting element therein and the correlated color temperature of the targeted mixed light.

Preferably, the fluorescent member for use in the light emitting device of an embodiment of the present invention includes the fluorescent material 70 and a sealing material. The sealing material may be a resin selected from a thermoplastic resin and a thermosetting resin. In consideration of easy producibility, examples of the resin for use as the sealing material include a silicone resin and an epoxy resin. The fluorescent member may contain any other component such as a filler, a light stabilizer and a colorant, in addition to the fluorescent material and the sealing material. Examples of the filler include silica, barium titanate, titanium oxide and aluminum oxide. The content of the other component than the fluorescent material and the sealing material in the fluorescent member varies depending on the size of the targeted light emitting device, the correlated color temperature of the targeted mixed light, the color deviation $d_{uv}$ of the mixed light, and the color tone of the mixed light, and can be set in a preferred range based on the targeted correlated color temperature, color deviation $d_{uv}$ and color tone. For example, the content of the other component than the fluorescent material and the sealing material in the fluorescent member may be in a range of 0.01 parts by mass or more and 20 parts by mass or less relative to 100 parts by mass of the sealing material therein.

EXAMPLES

The present invention is hereunder specifically described by reference to the following Examples. The present invention is not limited to these Examples.

Example 1

In the light emitting device 100, a nitride semiconductor having an emission peak wavelength of 450 nm was used as the light emitting element 10.

A silicone resin was used as the sealing material constituting the fluorescent member 50. As the first fluorescent material 71, a rare earth aluminate fluorescent material having an emission peak wavelength at 533 nm, as excited by the light from the light emitting element 10, and having a composition represented by $Y_3Al_5O_{12}$:Ce was used. As the second fluorescent material 72, a silicon nitride fluorescent material having an emission peak wavelength at 610 nm, as excited by the light from the light emitting element 10, and having a composition represented by (Sr,Ca)AlSiN$_3$:Eu was used. The first fluorescent material 71 and the second fluorescent material 72 were blended in such a manner that the correlated color temperature of a mixture of light from the light emitting element 10 and light from the fluorescent material 70 containing the first fluorescent material 71 and the second fluorescent material 72 could be around 2700 K, and the color deviation $d_{uv}$, as measured according to JIS Z8725, could be 0.01. In each Example and Comparative Example, $d_{uv}$ that is a deviation from the black body radiation track on the CIE1931 chromaticity diagram is a value measured according to JIS Z8725. The mass ratio of the second fluorescent material to the first fluorescent material (second fluorescent material/first fluorescent material) in Examples 1 and 2 and Comparative Examples 1 to 3 is shown in Table 1. The fluorescent material 70 containing the first fluorescent material 71 and the second fluorescent material 72 were added to the silicone resin, then mixed and dispersed, and defoamed to give a fluorescent member composition for constituting a fluorescent member. The fluorescent member composition was cast onto the light emitting element 10 in the concave portion of the molded body 40 to be filled in the concave portion, then heated at 150° C. for 3 hours so as to cure the fluorescent member composition to form the fluorescent member 50, thereby producing the light emitting device 100 as shown in FIG. 1.

Example 2

A light emitting device was produced in the same manner as in Example 1 except that the first fluorescent material 71 and the second fluorescent material 72 were blended so that the color deviation $d_{uv}$ of the mixed light could be 0.02.

Comparative Example 1

A light emitting device was produced in the same manner as in Example 1 except that the first fluorescent material 71 and the second fluorescent material 72 were blended so that the color deviation $d_{uv}$ of the mixed light could be 0.00.

Comparative Example 2

A light emitting device was produced in the same manner as in Example 1 except that the first fluorescent material 71 and the second fluorescent material 72 were blended so that the color deviation $d_{uv}$ of the mixed light could be −0.01.

Comparative Example 3

A light emitting device was produced in the same manner as in Example 1 except that the first fluorescent material 71 and the second fluorescent material 72 were blended so that the color deviation $d_{uv}$ of the mixed light could be −0.02.

Example 3

A nitride semiconductor having an emission peak wavelength of 450 nm was used as the light emitting element 10. As the first fluorescent material 71, a rare earth aluminate fluorescent material having an emission peak wavelength at 555 nm, as excited by the light from the light emitting element 10, was used. As the second fluorescent material 72, a silicon nitride fluorescent material having an emission peak wavelength at 610 nm, as excited by the light from the light emitting element 10, and having a composition represented by (Sr,Ca)AlSiN$_3$:Eu was used. Using the first fluorescent material and the second fluorescent material but changing the mass ratio of the second fluorescent material to the first fluorescent material (second fluorescent material/first fluorescent material), a light emitting device was produced in the same manner as in Example 1. The mass ratio of the second fluorescent material to the first fluorescent material (second fluorescent material/first fluorescent material) in Examples 3 to 6 and Comparative Examples 1 to 4 is shown in Table 2.

Example 4

A light emitting device was produced in the same manner as in Example 3 except that a silicon nitride fluorescent material having an emission peak wavelength at 615 nm, as excited by the light from the light emitting element 10, was used as the second fluorescent material 72, and the mass ratio of the second fluorescent material to the first fluorescent material (second fluorescent material/first fluorescent material) was changed.

Example 5

A light emitting device was produced in the same manner as in Example 3 except that a silicon nitride fluorescent material having an emission peak wavelength at 620 nm, as excited by the light from the light emitting element 10, was used as the second fluorescent material 72, and the mass ratio of the second fluorescent material to the first fluorescent material (second fluorescent material/first fluorescent material) was changed.

Example 6

A light emitting device was produced in the same manner as in Example 3 except that a silicon nitride fluorescent material having an emission peak wavelength at 625 nm, as excited by the light from the light emitting element 10, was used as the second fluorescent material 72, and the mass ratio of the second fluorescent material to the first fluorescent material (second fluorescent material/first fluorescent material) was changed.

Comparative Example 4

A light emitting device was produced in the same manner as in Example 3 except that a silicate fluorescent material having an emission peak wavelength at 523 nm, as excited by the light from the light emitting element 10, and having a composition represented by (Ca,Sr,Ba)$_8$MgSi$_4$O$_{16}$(F,Cl,Br)$_2$:Eu was used as the first fluorescent material 71, a silicon nitride fluorescent material having an emission peak wavelength at 620 nm, as excited by the light from the light emitting element 10, was used as the second fluorescent material 72, and the mass ratio of the second fluorescent material to the first fluorescent material (second fluorescent material/first fluorescent material) was changed.

Comparative Example 5

A light emitting device 100 was produced in the same manner as in Example 1 except that a nitride semiconductor having an emission peak wavelength at 420 nm was used as the light emitting element 10, and the mass ratio of the second fluorescent material to the first fluorescent material (second fluorescent material/first fluorescent material) was changed. The mass ratio of the second fluorescent material to the first fluorescent material (second fluorescent material/first fluorescent material) in Comparative Examples 1, 5 and 6 is shown in Table 3 along with that in Example 1.

Comparative Example 6

A light emitting device 100 was produced in the same manner as in Example 1 except that a nitride semiconductor having an emission peak wavelength at 490 nm was used as the light emitting element 10, and the mass ratio of the second fluorescent material to the first fluorescent material (second fluorescent material/first fluorescent material) was changed.

Example 7 and Comparative Example 7

Light emitting devices were produced in the same manner as in Example 1 except that the first fluorescent material 71 and the second fluorescent material 72 were blended in such a manner that the correlated color temperature of the mixed light could be around 2000 K, and the color deviation $d_{uv}$ could be 0.01 in Example 7 and 0.00 in Comparative Example 7. The mass ratio of the second fluorescent material to the first fluorescent material (second fluorescent material/first fluorescent material) in Examples 7 to 15 and Comparative Examples 7 to 13 is shown in Table 4.

Examples 8 and 9 and Comparative Example 8

Light emitting devices were produced in the same manner as in Example 1 except that the first fluorescent material 71 and the second fluorescent material 72 were blended in such a manner that the correlated color temperature of the mixed light could be around 3000 K, and the color deviation $d_{uv}$ could be 0.01 in Example 8, 0.02 in Example 9 and 0.00 in Comparative Example 8.

Examples 10 and 11 and Comparative Example 9

Light emitting devices were produced in the same manner as in Example 1 except that the first fluorescent material 71 and the second fluorescent material 72 were blended in such a manner that the correlated color temperature of the mixed light could be around 4000 K, and the color deviation $d_{uv}$ could be 0.01 in Example 10, 0.02 in Example 11 and 0.00 in Comparative Example 9.

Examples 12 and 13 and Comparative Example 10

Light emitting devices were produced in the same manner as in Example 1 except that the first fluorescent material 71 and the second fluorescent material 72 were blended in such a manner that the correlated color temperature of the mixed light could be around 5000 K, and the color deviation $d_{uv}$ could be 0.01 in Example 12, 0.02 in Example 13 and 0.00 in Comparative Example 10.

Examples 14 and 15 and Comparative Examples 11 to 13

Light emitting devices were produced in the same manner as in Example 1 except that the first fluorescent material 71 and the second fluorescent material 72 were blended in such a manner that the correlated color temperature of the mixed light could be around 6500 K, and the color deviation $d_{uv}$ could be 0.01 in Example 14, 0.02 in Example 15, 0.00 in Comparative Example 11, −0.01 in Comparative Example 12 and −0.02 in Comparative Example 13.

Examples 16 and 17 and Comparative Example 14

A nitride semiconductor having an emission peak wavelength at 450 nm was used as the light emitting element 10. As the first fluorescent material 71, a rare earth aluminate fluorescent material having an emission peak wavelength at 522 nm, as excited by the light from the light emitting element 10, was used. As the second fluorescent material 72, a silicon nitride fluorescent material having an emission peak wavelength at 610 nm, as excited by the light from the light emitting element 10, and having a composition represented by $(Sr,Ca)AlSiN_3$:Eu was used. Light emitting devices were produced in the same manner as in Example 1 except that the first fluorescent material and the second fluorescent material were blended in such a manner that the correlated color temperature of the mixed light could be around 8300 K, and the color deviation $d_{uv}$ could be 0.01 in Example 16, 0.02 in Example 17, and 0.00 in Comparative Example 14.

Examples 18 and 19 and Comparative Example 15

Light emitting devices were produced in the same manner as in Example 16 except that the first fluorescent material and the second fluorescent material were blended in such a manner that the correlated color temperature of the mixed light could be around 10000 K, and the color deviation $d_{uv}$ could be 0.01 in Example 18, 0.02 in Example 19, and 0.00 in Comparative Example 15.

Emission Spectrum (Spectral Distribution), Relative Emission Intensity (555 nm) (%)

Using a spectrofluorophotometer (product name: F-4500, manufactured by Hitachi Technologies Corporation), the emission spectrum (spectral distribution) of the mixed light emitted from the light emitting device of each Example and Comparative Example was measured. The results are shown in FIG. 3 to FIG. 12. The emission intensity at a wavelength of 555 nm at which humans could feel lightest in a photopic vision was measured, and based on the emission intensity at 555 nm of the light emitting device of Comparative Example having a targeted correlated color temperature with a color deviation $d_{uv}$ of 0, as 100%, the emission intensity at 555 nm of the light emitting devices of other Examples and Comparative Examples having a targeted correlated color temperature is referred to as a relative emission intensity (555 nm) (%) in each Example and Comparative Example. In the light emitting devices of Examples and Comparative Examples, the forward voltage (Vf) of the light emitting element was 2.88 (V). The results are shown in Table 1 to Table 4. The emission spectrum (spectral distribution) of each light emitting device of Examples and Comparative Examples is shown in FIG. 3 to FIG. 12. FIG. 3 to FIG. 12 each show an insect spectral luminous efficiency curve (Bickford) and a human standard spectral luminous efficiency curve (photopic vision) along with the emission spectrum (spectral distribution) of the light emitting device of Examples and Comparative Examples.

Relative Insect Attracting Index $(I/I_0)$ (%)

From the emission spectrum (spectral distribution) of the mixed light from the light emitting device of Examples and Comparative Examples, an insect attracting index I was calculated according to the following expression (1).

$$I = \frac{\int_{250}^{580} P(\lambda)S(\lambda)d\lambda}{\int_{380}^{780} P(\lambda)V(\lambda)d\lambda} \quad (1)$$

In the expression (1), I is an insect attracting index of the mixed light from the light emitting device of Examples and Comparative Examples, $P(\lambda)$ is a spectral distribution intensity relative to the wavelength of the mixed light from the light emitting device, $S(\lambda)$ is a wavelength-related insect spectral luminous efficiency, and $V(\lambda)$ is a wavelength-related human standard spectral luminous efficiency.

An insect attracting index $I_0$ of the reference light emitting device having a color deviation $d_{uv}$ of 0 was calculated according to the following expression (3).

$$I_0 = \frac{\int_{250}^{580} P_0(\lambda)S(\lambda)d\lambda}{\int_{380}^{780} P_0(\lambda)V(\lambda)d\lambda} \quad (3)$$

In the expression (3), $I_0$ is an insect attracting index of the mixed light from the reference light emitting device having a color deviation $d_{uv}$ of 0, $P_0(\lambda)$ is a spectral distribution intensity relative to the wavelength of the mixed light from the light emitting device, $S(\lambda)$ is a wavelength-related insect spectral luminous efficiency, and $V(\lambda)$ is a wavelength-related human standard spectral luminous efficiency.

A ratio of the insect attracting index I of the light emitted from the light emitting device of Examples and Comparative Examples having a targeted correlated color temperature, to the insect attracting index $I_0$ of the light from the reference light emitting device having a targeted correlated color temperature with a color deviation $d_{uv}$ of 0 $(I/I_0 \times 100(\%))$ was expressed as a relative insect attracting index $(I/I_0)$ (%). The results are shown in Table 1 to Table 4.

Chromaticity (x, y), Correlated Color Temperature, Average Color Rendering Index Ra Using an optical measurement system including a combination of a multichannel spectroscope and an integrating sphere, the light emitting device of each Example and Comparative Example was analyzed to measure the chromaticity coordinate (chromaticity x, y) of the emitted light, the correlated color temperature (Tcp; K) according to JIS Z8725, and the average color rendering index Ra according to JIS Z8726. The results are shown in Table 1 to Table 4.

TABLE 1

| | Emission Peak Wavelength of Light Emitting Element (nm) | Correlated Color Temperature (Tcp) (K) | | Color Deviation $d_{uv}$ | Mass Ratio (second fluorescent material/first fluorescent material) | Relative Insect attracting Index (I/I$_0$) (%) | Relative Emission Intensity 555 nm (%) | Chromaticity | | Average Color Rendering Index Ra |
|---|---|---|---|---|---|---|---|---|---|---|
| | | Targeted Value | Measured Value | | | | | x | y | |
| Example 1 | 450 | 2700 | 2719 | 0.01 | 0.14 | 78 | 110 | 0.478 | 0.446 | 68 |
| Example 2 | | | 2736 | 0.02 | 0.08 | 62 | 119 | 0.493 | 0.477 | 63 |
| Comparative Example 1 | | | 2705 | 0.00 | 0.20 | 100 | 100 | 0.456 | 0.405 | 70 |
| Comparative Example 2 | | | 2710 | −0.01 | 0.25 | 115 | 94 | 0.443 | 0.381 | 71 |
| Comparative Example 3 | | | 2703 | −0.02 | 0.33 | 134 | 87 | 0.428 | 0.354 | 72 |

As shown in Table 1, the light emitting devices of Examples 1 and 2 having a correlated color temperature around 2700 K and having a color deviation $d_{uv}$ falling within a range of more than 0 to 0.02 or less had a lower relative insect attracting index (I/I$_0$) and had a higher insect attraction depressing effect, as compared with the light emitting device of Comparative Example 1 having a correlated color temperature around 2700 K and having a color deviation $d_{uv}$ 0. In addition, the light emitting devices of Examples 1 and 2 had an average color rendering index Ra of not less than 60 and maintained a sufficient color rendering property in human visual environments for ordinary works. The relative emission intensity at 555 nm, at which humans could feel lightest in a photopic vision, of the light emitting devices of Examples 1 and 2 was higher than that of the light emitting devices of Comparative Examples 1 to 3 having a color deviation $d_{uv}$ of not more than 0. On the other hand, the light emitting devices of Comparative Examples 1 to 3 having a color deviation $d_{uv}$ of not more than 0 had a relative insect attracting index (I/I$_0$) of 100% or more, and had a lower insect attraction depressing effect than the light emitting devices of Examples 1 and 2. In addition, the relative emission intensity at 555 nm of the comparative devices was low.

Figure 3:
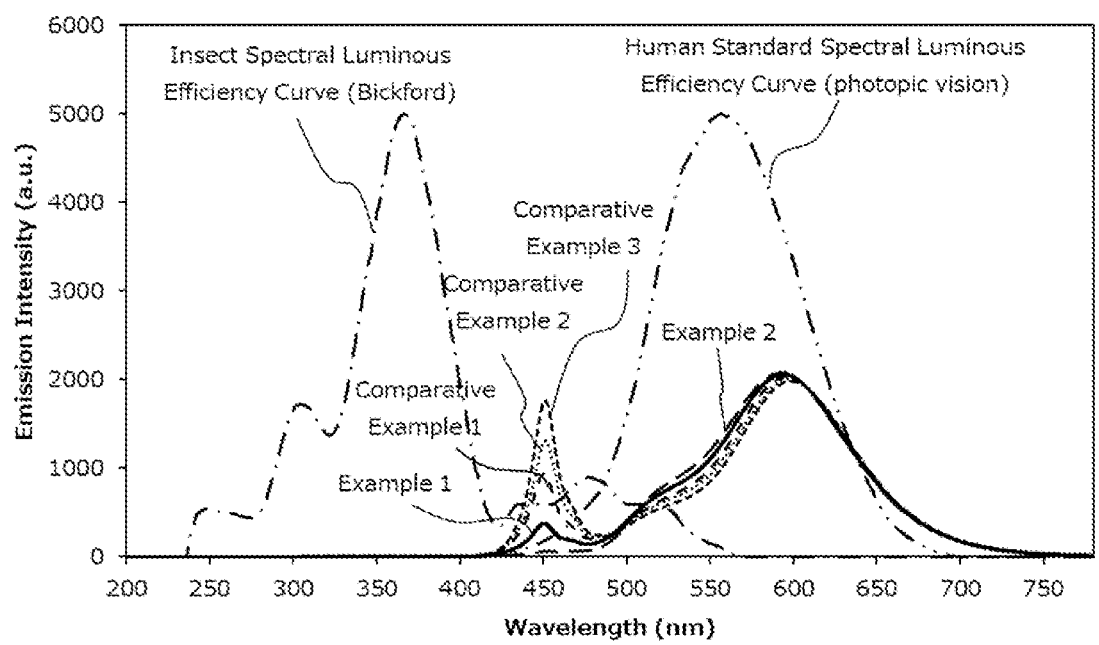
FIG. 3 is a graph showing a spectral distribution of the light emitting devices of Examples 1 and 2 at a correlated color temperature around 2700 K, a spectral distribution of the light emitting devices of Comparative Examples 1 to 3 at a correlated color temperature around 2700 K, an insect spectral luminous efficiency curve (Bickford), and a human standard spectral luminous efficiency curve (photopic vision).

As shown in FIG. 3, in a wavelength range of 430 nm to 470 nm overlapping with an insect spectral luminous efficiency curve (Bickford), the emission intensity of the light emitting devices of Examples 1 and 2 was lower than the emission intensity of the light emitting devices of Comparative Examples 1 to 3 having a color deviation $d_{uv}$ of not more than 0, which demonstrated that the light emitting devices of Examples 1 and 2 had a high insect attraction depressing effect. Also as shown in FIG. 3, in a wavelength range of 500 nm to 600 nm overlapping with a human standard spectral luminous efficiency curve (photopic vision), the emission intensity of the light emitting devices of Examples 1 and 2 was higher than the emission intensity of the light emitting devices of Comparative Examples 1 to 3 having a color deviation $d_{uv}$ of not more than 0, that is, the emission intensity of the light emitting devices of Examples 1 and 2 was high in a wavelength range in which humans feel brightness.

TABLE 2

| | Emission Peak Wavelength of Light Emitting Element (nm) | Correlated Color Temperature (Tcp) (K) | | Color Deviation $d_{uv}$ | Mass Ratio (second fluorescent material/first fluorescent material) | Relative Insect attracting Index (I/I$_0$) (%) | Relative Emission Intensity 555 nm (%) | Chromaticity | | Average Color Rendering Index Ra |
|---|---|---|---|---|---|---|---|---|---|---|
| | | Targeted Value | Measured Value | | | | | x | y | |
| Comparative Example 1 | 450 | 2700 | 2705 | 0.00 | 0.20 | 100 | 100 | 0.456 | 0.405 | 70 |
| Example 3 | | | 2709 | 0.01 | 0.11 | 69 | 122 | 0.478 | 0.445 | 64 |
| Example 4 | | | 2651 | 0.01 | 0.08 | 68 | 117 | 0.483 | 0.444 | 67 |
| Example 5 | | | 2680 | 0.01 | 0.06 | 72 | 116 | 0.479 | 0.442 | 68 |
| Example 6 | | | 2679 | 0.01 | 0.04 | 71 | 115 | 0.480 | 0.444 | 69 |
| Comparative Example 4 | | | 2597 | 0.01 | 0.20 | 95 | 69 | 0.485 | 0.440 | 89 |

As shown in Table 2, the light emitting devices of Examples 3 to 6 having a correlated color temperature around 2700 K and having a color deviation $d_{uv}$ 0.01 all had a lower relative insect attracting index (I/I$_0$) and had a higher insect attraction depressing effect, as compared with the light emitting device of Comparative Example 1. In addition, the light emitting devices of Examples 3 to 6 had an average color rendering index Ra of not less than 60 and maintained a sufficient color rendering property in human visual environments for ordinary works. The relative emission intensity at 555 nm, at which humans could feel lightest in a photopic vision, of the light emitting devices of Examples 3 to 6 was higher than that of the light emitting device of Comparative Example 1. On the other hand, the light emitting device of Comparative Example 4 having a correlated color temperature around 2700 K and having a color deviation $d_{uv}$ of 0.01 had a low relative emission intensity at 555 nm.

Figure 4:
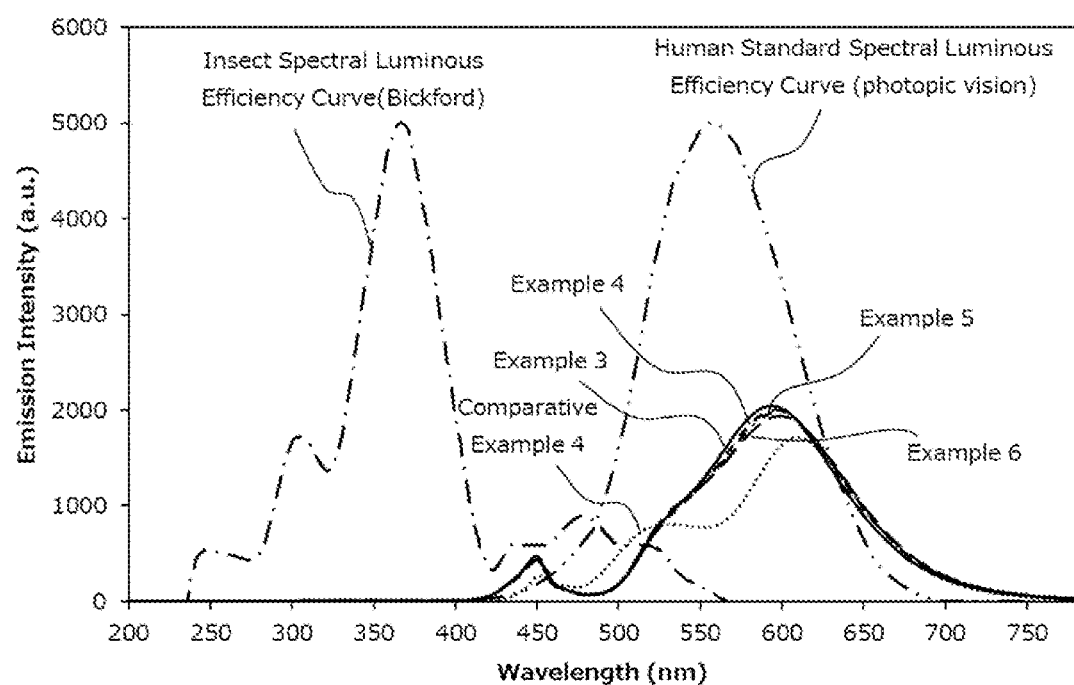
FIG. 4 is a graph showing the spectral distribution of the light emitting devices of Examples 3 to 6 at a correlated color temperature around 2700 K, the spectral distribution of the light emitting device of Comparative Example 4 at a correlated color temperature around 2700 K, an insect spectral luminous efficiency curve (Bickford), and a human standard spectral luminous efficiency curve (photopic vision).

As shown in FIG. 4, in a wavelength range of 430 nm to 500 nm overlapping with an insect spectral luminous efficiency curve (Bickford), the emission intensity of the light emitting devices of Examples 3 to 6 was lower than the emission intensity of the light emitting device of Comparative Example 4, which demonstrated that the light emitting devices of Examples 3 to 6 had a high insect attraction depressing effect. Also as shown in FIG. 4, in a wavelength range of 530 nm to 600 nm overlapping with a human standard spectral luminous efficiency curve (photopic vision), the emission intensity of the light emitting devices of Examples 3 to 6 was higher than the emission intensity of the light emitting device of Comparative Example 4, that is, the emission intensity of the light emitting devices of Examples 3 to 6 was high in a wavelength range in which humans feel brightness.

shifted to the long wavelength side than in Comparative Example 1. The light emitting devices of Comparative Examples 5 and 6 had a higher relative insect attracting index ($I/I_0$) than the light emitting device of Comparative Example 1 and had a low insect attraction depressing effect. The relative emission intensity at 555 nm, at which humans could feel lightest in a photopic vision, of the light emitting devices of Comparative Examples 5 and 6 was lower than that of the light emitting device of Comparative Example 1.

Figure 5:
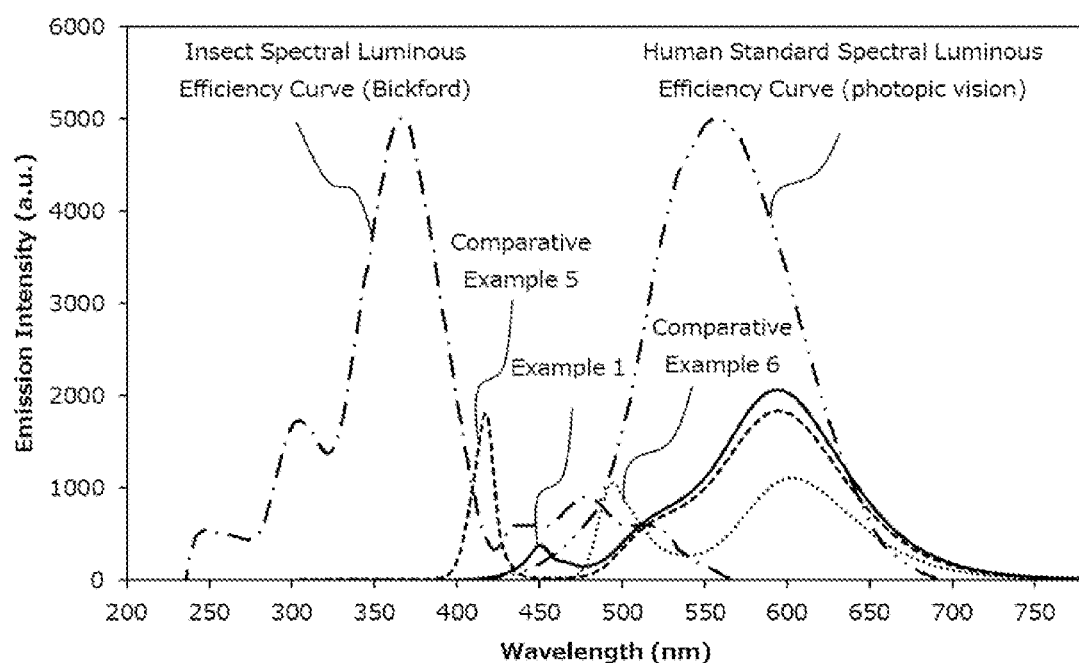
FIG. 5 is a graph showing the spectral distribution of the light emitting device of Example 1 at a correlated color temperature around 2700 K, the spectral distribution of the light emitting devices of Comparative Examples 5 and 6 at a correlated color temperature around 2700 K, an insect spectral luminous efficiency curve (Bickford), and a human standard spectral luminous efficiency curve (photopic vision).

As shown in FIG. 5, in a wavelength range of 400 nm to 450 nm overlapping with an insect spectral luminous efficiency curve (Bickford), the emission intensity of the light emitting device of Comparative Example 5 was high, that is, the light emitting device of Comparative Example 5 does not

TABLE 3

| | Emission Peak Wavelength of Light Emitting Element (nm) | Correlated Color Temperature (Tcp) (K) | | Color Deviation $d_{uv}$ | Mass Ratio (second fluorescent material/first fluorescent material) | Relative Insect attracting Index ($I/I_0$) (%) | Relative Emission Intensity 555 nm (%) | Chromaticity | | Average Color Rendering Index Ra |
|---|---|---|---|---|---|---|---|---|---|---|
| | | Targeted Value | Measured Value | | | | | x | y | |
| Comparative Example 1 | 450 | 2700 | 2705 | 0.00 | 0.20 | 100 | 100 | 0.456 | 0.405 | 70 |
| Example 1 | 450 | | 2719 | 0.01 | 0.14 | 78 | 110 | 0.478 | 0.446 | 68 |
| Comparative Example 5 | 420 | | 2700 | 0.01 | 0.09 | 125 | 98 | 0.480 | 0.443 | 67 |
| Comparative Example 6 | 490 | | 2660 | 0.01 | 0.14 | 133 | 32 | 0.480 | 0.442 | 71 |

As shown in Table 3, the light emitting device of Comparative Example 5 uses the light emitting element 10 having an emission peak wavelength shifted to the short wavelength side than in Comparative Example 1. The light emitting device of Comparative Example 6 uses the light emitting element 10 having an emission peak wavelength have an insect attraction depressing effect. As shown in FIG. 5, in a wavelength range of 470 nm to 550 nm overlapping with an insect spectral luminous efficiency curve (Bickford), the emission intensity of the light emitting device of Comparative Example 6 was high, that is, the insect attraction depressing effect thereof was low.

TABLE 4

| | Emission Peak Wavelength of Light Emitting Element (nm) | Correlated Color Temperature (Tcp) (K) | | Color Deviation $d_{uv}$ | Mass Ratio (second fluorescent material/first fluorescent material) | Relative Insect attracting Index ($I/I_0$) (%) | Relative Emission Intensity 555 nm (%) | Chromaticity | | Average Color Rendering Index Ra |
|---|---|---|---|---|---|---|---|---|---|---|
| | | Targeted Value | Measured Value | | | | | x | y | |
| Example 7 | 450 | 2000 | 1992 | 0.01 | 0.18 | 71 | 99 | 0.546 | 0.438 | 60 |
| Comparative Example 7 | | | 1995 | 0.00 | 0.38 | 100 | 100 | 0.527 | 0.413 | 61 |
| Example 8 | 450 | 3000 | 3069 | 0.01 | 0.11 | 84 | 111 | 0.447 | 0.435 | 70 |
| Example 9 | | | 3042 | 0.02 | 0.08 | 68 | 118 | 0.466 | 0.470 | 67 |
| Comparative Example 8 | | | 3034 | 0.00 | 0.16 | 100 | 100 | 0.432 | 0.398 | 72 |
| Example 10 | 450 | 4000 | 4062 | 0.01 | 0.07 | 95 | 106 | 0.385 | 0.402 | 73 |
| Example 11 | | | 3999 | 0.02 | 0.06 | 84 | 115 | 0.396 | 0.433 | 70 |
| Comparative Example 9 | | | 4015 | 0.00 | 0.10 | 100 | 100 | 0.382 | 0.384 | 75 |
| Example 12 | 450 | 5000 | 5053 | 0.01 | 0.05 | 96 | 108 | 0.346 | 0.376 | 73 |
| Example 13 | | | 5003 | 0.02 | 0.04 | 89 | 116 | 0.349 | 0.398 | 70 |
| Comparative Example 10 | | | 4964 | 0.00 | 0.07 | 100 | 100 | 0.346 | 0.354 | 77 |
| Example 14 | 450 | 6500 | 6687 | 0.01 | 0.04 | 98 | 105 | 0.308 | 0.338 | 75 |
| Example 15 | | | 6675 | 0.02 | 0.01 | 95 | 112 | 0.305 | 0.356 | 71 |
| Comparative Example 11 | | | 6679 | 0.00 | 0.05 | 100 | 100 | 0.310 | 0.327 | 78 |

TABLE 4-continued

| | Emission Peak Wavelength of Light Emitting Element (nm) | Correlated Color Temperature (Tcp) (K) | | Color Deviation $d_{uv}$ | Mass Ratio (second fluorescent material/first fluorescent material) | Relative Insect attracting Index $(I/I_0)$ (%) | Relative Emission Intensity 555 nm (%) | Chromaticity | | Average Color Rendering Index Ra |
|---|---|---|---|---|---|---|---|---|---|---|
| | | Targeted Value | Measured Value | | | | | x | y | |
| Comparative Example 12 | | | 6720 | −0.01 | 0.09 | 105 | 90 | 0.313 | 0.305 | 83 |
| Comparative Example 13 | | | 6678 | −0.02 | 0.13 | 108 | 83 | 0.316 | 0.290 | 85 |
| Example 16 | 450 | 8300 | 8370 | 0.01 | 0.03 | 99 | 107 | 0.287 | 0.315 | 80 |
| Example 17 | | | 8364 | 0.02 | 0.02 | 97 | 114 | 0.282 | 0.330 | 75 |
| Comparative Example 14 | | | 8355 | 0.00 | 0.05 | 100 | 100 | 0.292 | 0.302 | 84 |
| Example 18 | 450 | 10000 | 10088 | 0.01 | 0.03 | 99 | 108 | 0.274 | 0.300 | 79 |
| Example 19 | | | 9990 | 0.02 | 0.02 | 98 | 115 | 0.268 | 0.313 | 74 |
| Comparative Example 15 | | | 9983 | 0.00 | 0.04 | 100 | 100 | 0.281 | 0.288 | 84 |

As shown in Table 4, the light emitting devices of Examples 7 to 19 having a correlated color temperature around 2000 K, around 3000 K, around 4000 K, around 5000 K, around 6500 K, around 8300 K or around 10000 K, and having a color deviation $d_{uv}$ falling within a range of more than 0 to 0.02 or less had a lower relative insect attracting index $(I/I_0)$ and had a higher insect attraction depressing effect, as compared with the light emitting devices of Comparative Examples 7 to 15 having a correlated color temperature as above and having a color deviation $d_{uv}$ 0 or less. In addition, the light emitting devices of Examples 7 to 19 all had an average color rendering index Ra of not less than 60 and maintained a sufficient color rendering property in human visual environments for ordinary works. The relative emission intensity at 555 nm, at which humans could feel lightest in a photopic vision, of the light emitting device of Example 7 was almost the same as that of the light emitting device of Comparative Example 7. The relative emission intensity at 555 nm, at which humans could feel lightest in a photopic vision, of the light emitting devices of 8 to 19 was higher than that of the light emitting devices of Comparative Examples 8 to 15 having a different correlated color temperature.

Figure 6:
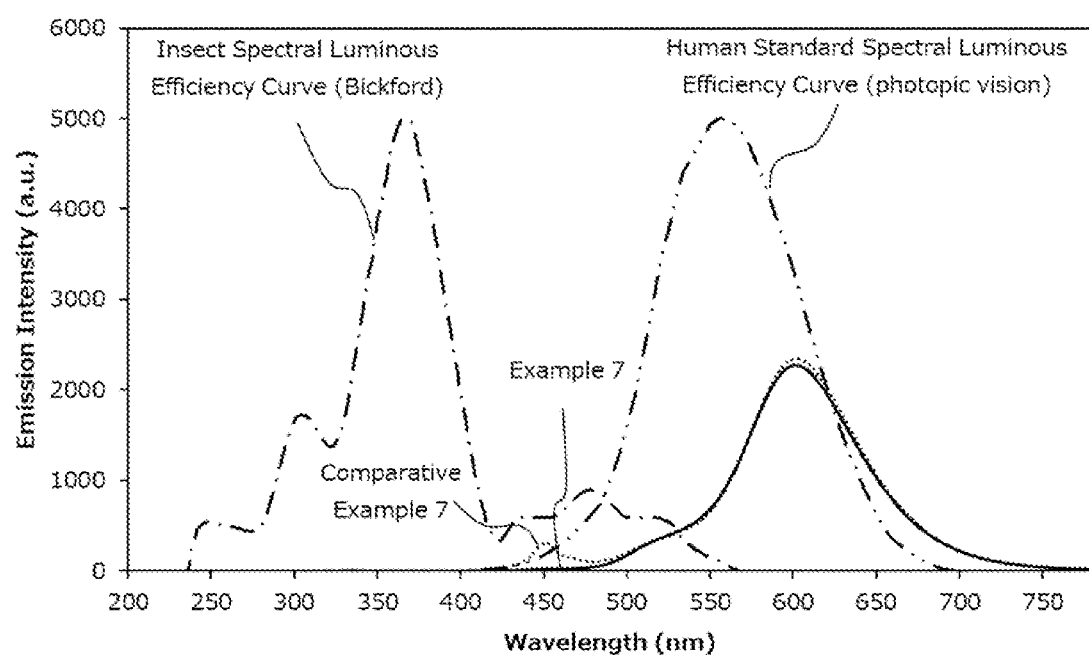
FIG. 6 is a graph showing the spectral distribution of the light emitting device of Example 7 at a correlated color temperature around 2000 K, the spectral distribution of the light emitting device of Comparative Example 7 at a correlated color temperature around 2000 K, an insect spectral luminous efficiency curve (Bickford), and a human standard spectral luminous efficiency curve (photopic vision).

As shown in FIG. 6, in a wavelength range of 430 nm to 470 nm overlapping with an insect spectral luminous efficiency curve (Bickford), the emission intensity of the light emitting device of Example 7 having a correlated color temperature around 2000 K and having a color deviation $d_{uv}$ 0.01 was lower than the emission intensity of the light emitting device of Comparative Example 7, which demonstrated that the light emitting device of Example 7 had a high insect attraction depressing effect. As shown in FIG. 6, the light emitting device of Comparative Example 7 had an emission peak wavelength in a wavelength range of 430 nm to 470 nm overlapping with an insect spectral luminous efficiency curve (Bickford), and had a low insect attraction depressing effect.

Figure 7:
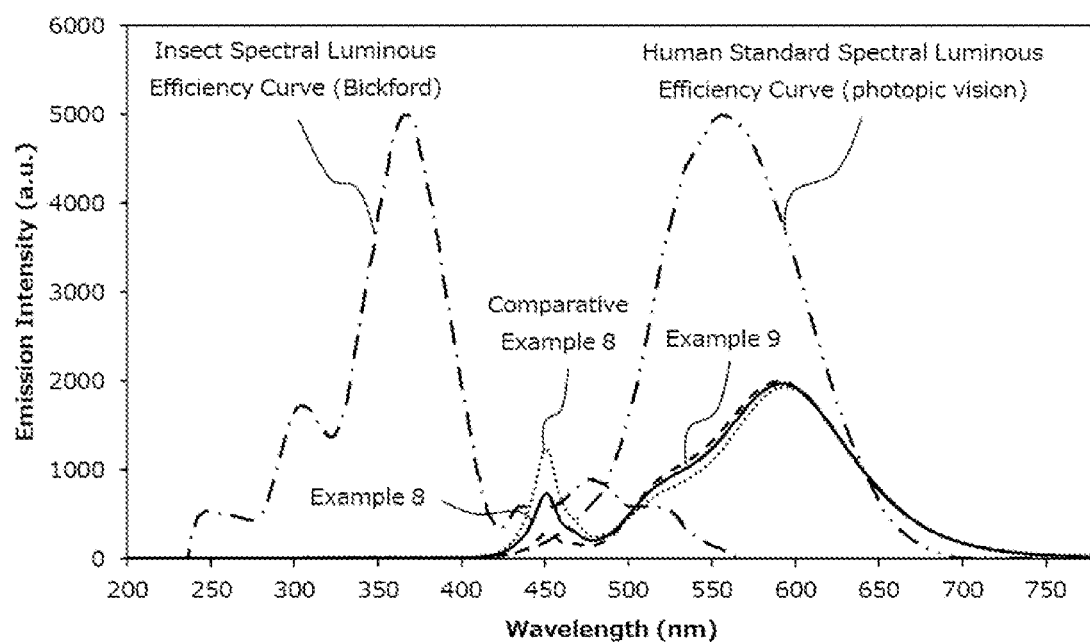
FIG. 7 is a graph showing the spectral distribution of the light emitting devices of Examples 8 and 9 at a correlated color temperature around 3000 K, the spectral distribution of the light emitting device of Comparative Example 8 at a correlated color temperature around 3000 K, an insect spectral luminous efficiency curve (Bickford), and a human standard spectral luminous efficiency curve (photopic vision).

As shown in FIG. 7, in a wavelength range of 430 nm to 470 nm overlapping with an insect spectral luminous efficiency curve (Bickford), the emission intensity of the light emitting devices of Example 8 and 9 having a correlated color temperature around 3000 K and having a color deviation $d_{uv}$ falling within a range of more than 0 to 0.02 or less was lower than the emission intensity of the light emitting device of Comparative Example 8, which demonstrated that the light emitting devices of Examples 8 and 9 had a high insect attraction depressing effect. Also as shown in FIG. 7, in a wavelength range of 500 nm to 600 nm overlapping with a human standard spectral luminous efficiency curve (photopic vision), the emission intensity of the light emitting devices of Examples 8 and 9 was higher than the emission intensity of the light emitting device of Comparative Example 8, that is, the emission intensity of the light emitting devices of Examples 8 and 9 was high in a wavelength range in which humans feel brightness.

Figure 8:
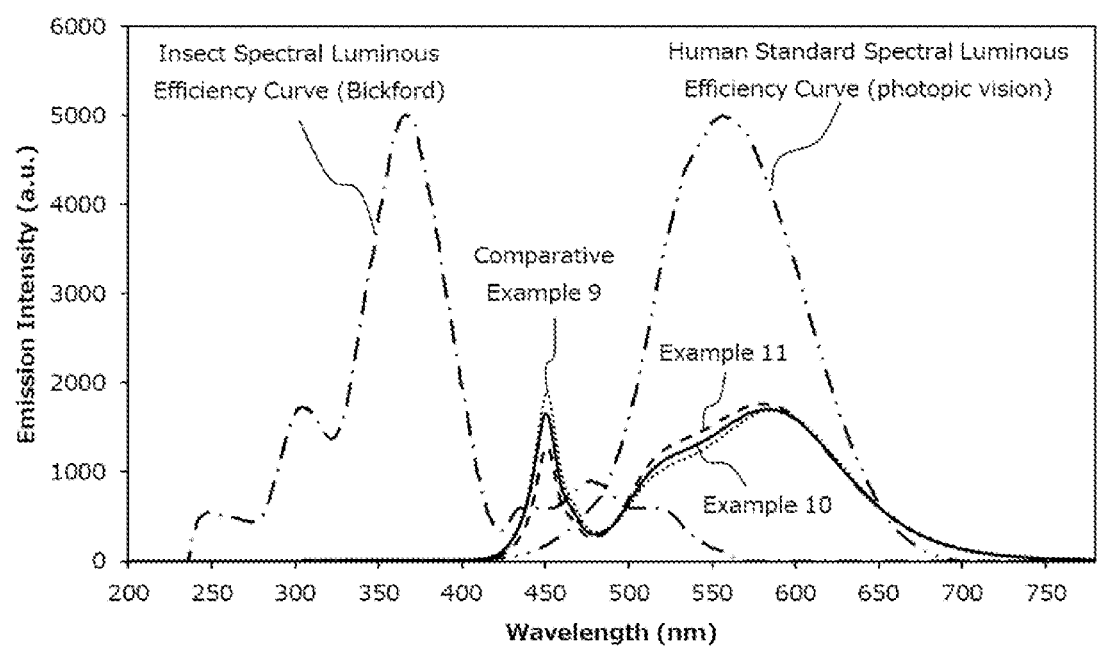
FIG. 8 is a graph showing the spectral distribution of the light emitting devices of Examples 10 and 11 at a correlated color temperature around 4000 K, the spectral distribution of the light emitting device of Comparative Example 9 at a correlated color temperature around 4000 K, an insect spectral luminous efficiency curve (Bickford), and a human standard spectral luminous efficiency curve (photopic vision).

As shown in FIG. 8, in a wavelength range of 430 nm to 470 nm overlapping with an insect spectral luminous efficiency curve (Bickford), the emission intensity of the light emitting devices of Example 10 and 11 having a correlated color temperature around 4000 K and having a color deviation $d_{uv}$ falling within a range of more than 0 to 0.02 or less was lower than the emission intensity of the light emitting device of Comparative Example 9, which demonstrated that the light emitting devices of Examples 10 and 11 had a high insect attraction depressing effect. Also as shown in FIG. 8, in a wavelength range of 500 nm to 600 nm overlapping with a human standard spectral luminous efficiency curve (photopic vision), the emission intensity of the light emitting devices of Examples 10 and 11 was higher than the emission intensity of the light emitting device of Comparative Example 9, that is, the emission intensity of the light emitting devices of Examples 10 and 11 was high in a wavelength range in which humans feel brightness.

Figure 9:
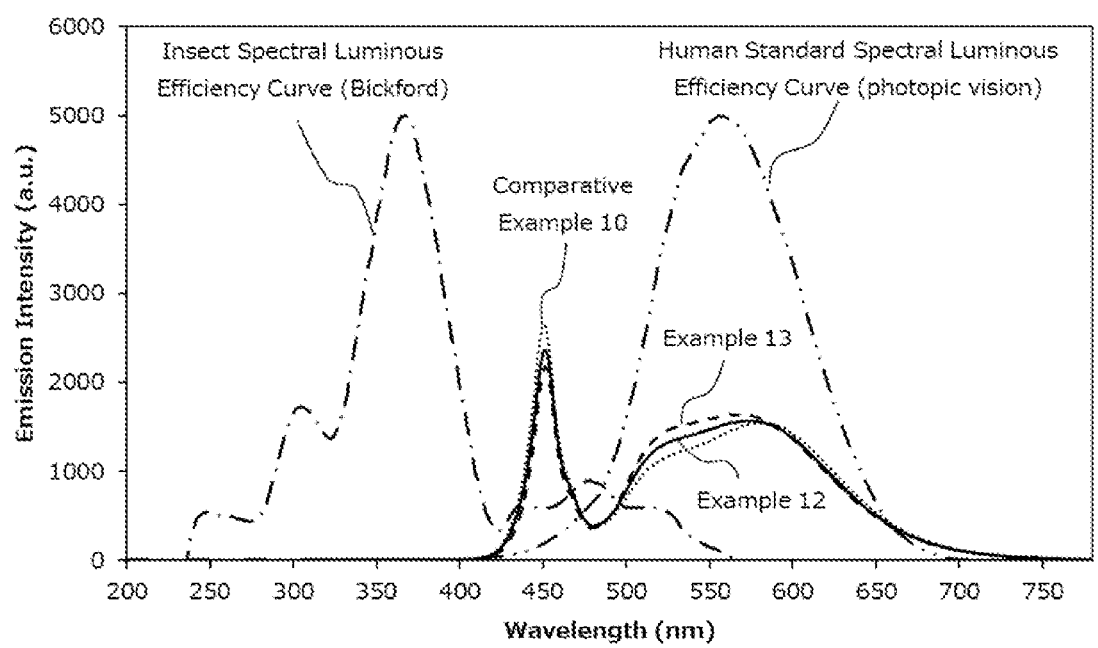
FIG. 9 is a graph showing the spectral distribution of the light emitting devices of Examples 12 and 13 at a correlated color temperature around 5000 K, the spectral distribution of the light emitting device of Comparative Example 10 at a correlated color temperature around 5000 K, an insect spectral luminous efficiency curve (Bickford), and a human standard spectral luminous efficiency curve (photopic vision).

As shown in FIG. 9, in a wavelength range of 430 nm to 470 nm overlapping with an insect spectral luminous efficiency curve (Bickford), the emission intensity of the light emitting devices of Example 12 and 13 having a correlated color temperature around 5000 K and having a color deviation $d_{uv}$ falling within a range of more than 0 to 0.02 or less was lower than the emission intensity of the light emitting device of Comparative Example 10, which demonstrated that the light emitting devices of Examples 12 and 13 had a high insect attraction depressing effect. Also as shown in FIG. 9, in a wavelength range of 500 nm to 600 nm overlapping with a human standard spectral luminous efficiency curve (photopic vision), the emission intensity of the light emitting devices of Examples 12 and 13 was higher than the emission intensity of the light emitting device of Comparative Example 10, that is, the emission intensity of the light emitting devices of Examples 12 and 13 was high in a wavelength range in which humans feel brightness.

Figure 10:
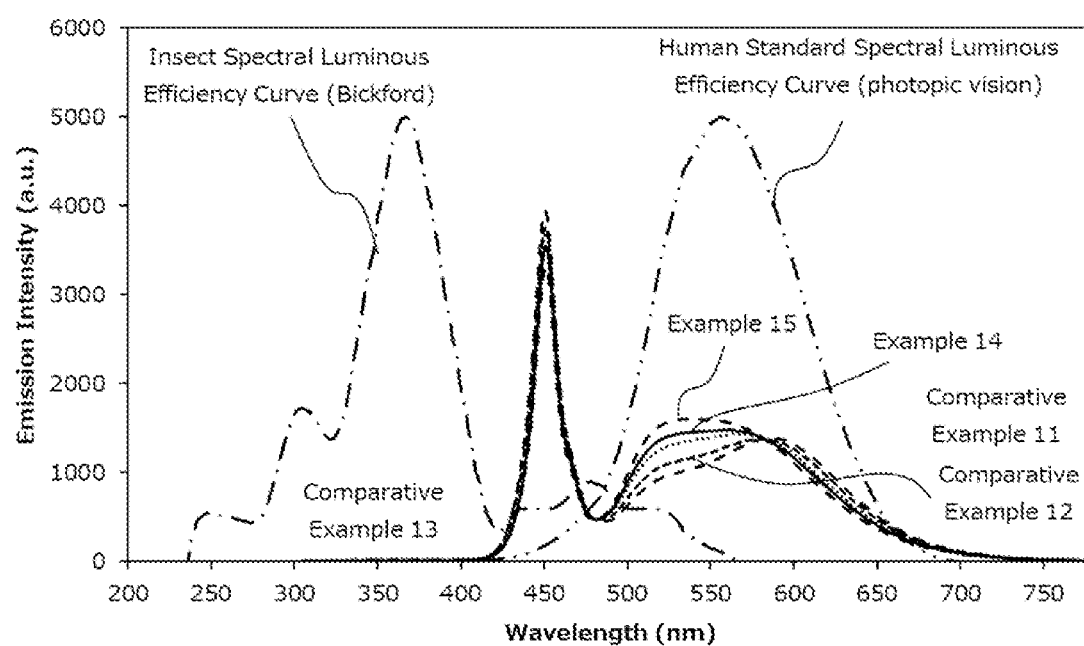
FIG. 10 is a graph showing the spectral distribution of the light emitting devices of Examples 14 and 15 at a correlated color temperature around 6500 K, the spectral distribution of the light emitting devices of Comparative Examples 11 to 13 at a correlated color temperature around 6500 K, an insect spectral luminous efficiency curve (Bickford), and a human standard spectral luminous efficiency curve (photopic vision).

As shown in FIG. 10, in a wavelength range of 430 nm to 470 nm overlapping with an insect spectral luminous efficiency curve (Bickford), the emission intensity of the light emitting devices of Example 14 and 15 having a correlated color temperature around 6500 K and having a color deviation $d_{uv}$ falling within a range of more than 0 to 0.02 or less was somewhat lower than the emission intensity of the light emitting devices of Comparative Examples 11 to 13, that is, the light emitting devices of Examples 14 and 15 had an insect attraction depressing effect. Also as shown in FIG. 10, in a wavelength range of 500 nm to 600 nm overlapping with a human standard spectral luminous efficiency curve (photopic vision), the emission intensity of the light emitting devices of Examples 14 and 15 was higher than the emission intensity of the light emitting devices of Comparative Examples 11 to 13, that is, the emission intensity of the light emitting devices of Examples 14 and 15 was high in a wavelength range in which humans feel brightness.

Figure 11:
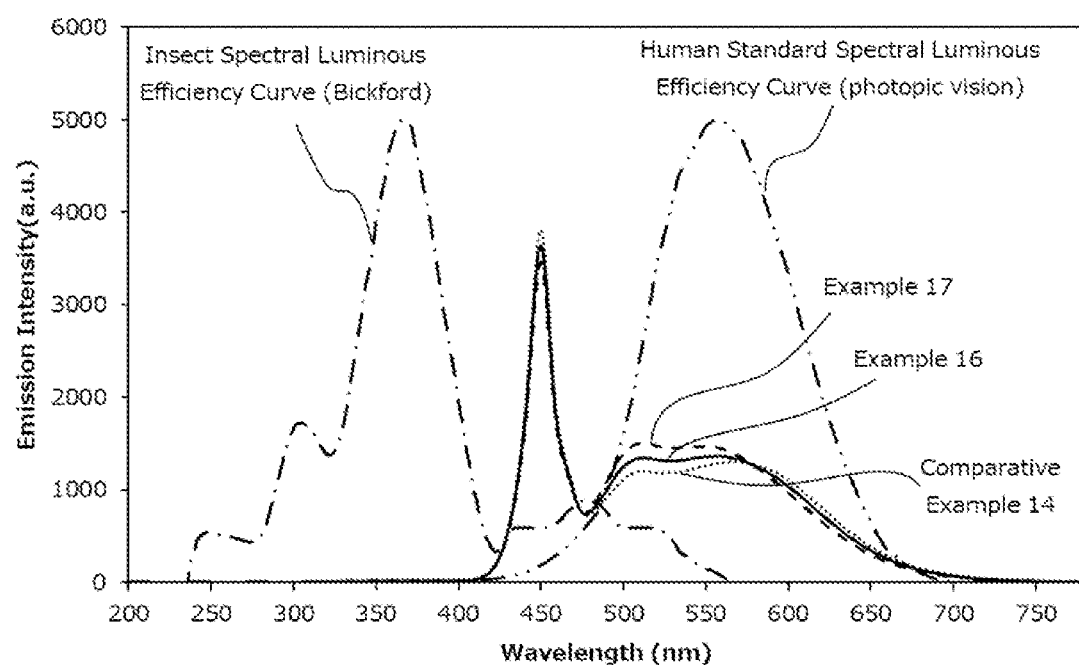
FIG. 11 is a graph showing the spectral distribution of the light emitting devices of Examples 16 and 17 at a correlated color temperature around 8300 K, the spectral distribution of the light emitting device of Comparative Example 14 at a correlated color temperature around 8300 K, an insect spectral luminous efficiency curve (Bickford), and a human standard spectral luminous efficiency curve (photopic vision).

As shown in FIG. 11, in a wavelength range of 430 nm to 470 nm overlapping with an insect spectral luminous efficiency curve (Bickford), the emission intensity of the light emitting devices of Example 16 and 17 having a correlated color temperature around 8300 K and having a color deviation $d_{uv}$ falling within a range of more than 0 to 0.02 or less was somewhat lower than the emission intensity of the light emitting device of Comparative Example 14, that is, the light emitting devices of Examples 16 and 17 had an insect attraction depressing effect. Also as shown in FIG. 11, in a wavelength range of 500 nm to 600 nm overlapping with a human standard spectral luminous efficiency curve (photopic vision), the emission intensity of the light emitting devices of Examples 16 and 17 was higher than the emission intensity of the light emitting device of Comparative Example 14, that is, the emission intensity of the light emitting devices of Examples 16 and 17 was high in a wavelength range in which humans feel brightness.

Figure 12:
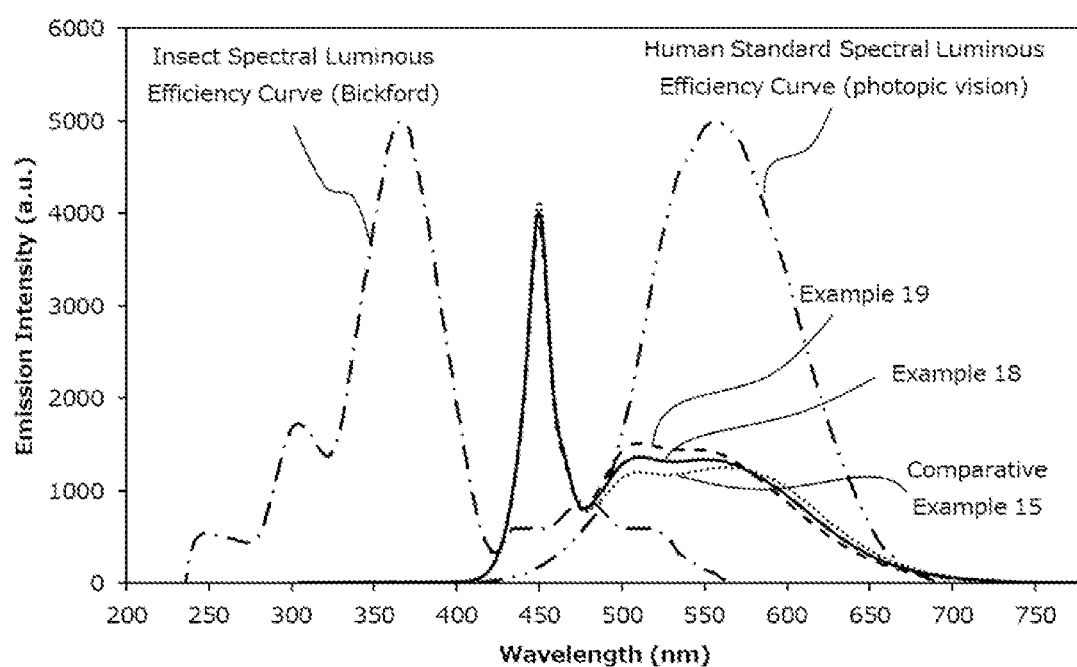
FIG. 12 is a graph showing the spectral distribution of the light emitting devices of Examples 18 and 19 at a correlated color temperature around 10000 K, the spectral distribution of the light emitting device of Comparative Example 15 at a correlated color temperature around 10000 K, an insect spectral luminous efficiency curve (Bickford), and a human standard spectral luminous efficiency curve (photopic vision).

As shown in FIG. 12, in a wavelength range of 430 nm to 470 nm overlapping with an insect spectral luminous efficiency curve (Bickford), the emission intensity of the light emitting devices of Example 18 and 19 having a correlated color temperature around 10000 K and having a color deviation $d_{uv}$ falling within a range of more than 0 to 0.02 or less was somewhat lower than the emission intensity of the light emitting device of Comparative Example 15, that is, the light emitting devices of Examples 18 and 19 had an insect attraction depressing effect. Also as shown in FIG. 12, in a wavelength range of 500 nm to 600 nm overlapping with a human standard spectral luminous efficiency curve (photopic vision), the emission intensity of the light emitting devices of Examples 18 and 19 was higher than the emission intensity of the light emitting device of Comparative Example 15, that is, the emission intensity of the light emitting devices of Examples 18 and 19 was high in a wavelength range in which humans feel brightness.

The light emitting device of an embodiment of the present disclosure can be utilized as street lights, illumination devices to be placed outdoors in ports and harbors and tunnels, and illumination devices to be placed indoors in offices, general households, commercial facilities, factories and others that are required to have an insect attraction depressing effect.

The invention claimed is:
1. A method for producing a light emitting device comprising:
preparing a light emitting element having an emission peak wavelength in a range of 430 nm to 470 nm; and
a fluorescent member comprising a fluorescent material that is excited by light from the light emitting element for light emission; and
forming the fluorescent member onto the light emitting element;
wherein the fluorescent material contains a first fluorescent material having an emission peak wavelength in a range of 530 nm or more and 580 nm or less and a second fluorescent material having an emission peak wavelength in a range of 600 nm or more and 670 nm or less, and wherein a mass ratio of the second fluorescent material to the first fluorescent material falls within a range of 0.005 or more and 0.27 or less, wherein
a mixture of the light from the light emitting element and light from the fluorescent material has a correlated color temperature of 1500 K to 11000 K, as measured according to JIS Z8725,
a color deviation $d_{uv}$ that is a deviation from a black body radiation track on a CIE1931 chromaticity diagram of the mixture of light and is measured according to JIS Z8725 falls within a range of 0.01 or more to 0.02 or less at the correlated color temperature of 1500 K to 11000 K,
wherein the second fluorescent material contains at least one fluorescent material selected from the group consisting of a silicon nitride fluorescent material containing a composition represented by a following formula (i), an alkaline earth metal silicon nitride fluorescent material containing a composition represented by a following formula (ii), a fluoride fluorescent material containing a composition represented by a following formula (iii), and a fluorogermanate fluorescent material containing a composition represented by a following formula (iv),

$$(Ca_{1-s-t}Sr_sEu_t)_xAl_uSi_vN_w \quad \text{(i)}$$

wherein in the formula (i), s, t, u, v, w and x each represent a number satisfying $0 \leq s \leq 1.0$, $0 < t < 1.0$, $0 < s+t < 1.0$, $0.8 \leq x \leq 1.0$, $0.8 \leq u \leq 1.2$, $0.8 \leq v \leq 1.2$, $1.9 \leq u+v \leq 2.1$, and $2.5 \leq w \leq 3.5$, $$(Ca_{1-p-q-r}Sr_pBa_qEu_r)_2Si_5N_8 \quad \text{(ii)}$$

wherein in the formula (ii), p, q and r each represent a number satisfying $0 \leq p \leq 1.0$, $0 \leq q \leq 1.0$, $0 < r < 1.0$ and $p+q+r \leq 1.0$, $$A_2[M^1_{1-g}Mn^{4+}{}_gF_6] \quad \text{(iii)}$$

wherein in the formula (iii), A is at least one selected from the group consisting of K, Li, Na, Rb, Cs and $NH_4^+$, $M^1$ is at least one element selected from the group consisting of a Group 4 element and a Group 14 element, and g is a number satisfying $0 < g < 0.2$, $$(i-j)MgO.(j/2)Sc_2O_3.kMgF_2.mCaF_2.(1-n)GeO_2.(n/2)M^3{}_2O_3:zMn^{4+} \quad \text{(iv)}$$

wherein in the formula (iv), $M^3$ is at least one selected from the group consisting of Al, Ga and In, i, j, k, m, n and z each represent a number satisfying $2 \leq i \leq 4$, $0 \leq j < 0.5$, $0 < k < 1.5$, $0 \leq m < 1.5$, $0 < n < 0.5$, and $0 < z < 0.05$.

2. The method for producing the light emitting device according to claim 1,
wherein an insect attracting index I is calculated according to the following expression (1) relative to an insect attracting index $I_0$ of 100% calculated according to the following formula (3) is 50% or more and 99% or less, or the insect attracting index I is calculated according to the following expression (2) relative to an insect attracting index $I_0$ of 100% calculated according to the following formula (4) is 50% or more and 99% or less:

$$I = \frac{\int_{250}^{580} P(\lambda)S(\lambda)d\lambda}{\int_{380}^{780} P(\lambda)V(\lambda)d\lambda} \quad (1)$$

$$I = \frac{\int_{250}^{615} P(\lambda)S(\lambda)d\lambda}{\int_{380}^{780} P(\lambda)V(\lambda)d\lambda} \quad (2)$$

wherein in the expression (1) or the expression (2), I is an insect attracting index of mixed light from the light emitting device, $P(\lambda)$ is a spectral distribution intensity relative to the wavelength of the mixed light from the light emitting device, $S(\lambda)$ is a wavelength-related insect spectral luminous efficiency, and $V(\lambda)$ is a wavelength-related human standard spectral luminous efficiency, $$I_0 = \frac{\int_{250}^{580} P_0(\lambda)S(\lambda)d\lambda}{\int_{380}^{780} P_0(\lambda)V(\lambda)d\lambda} \quad (3)$$

$$I_0 = \frac{\int_{250}^{615} P_0(\lambda)S(\lambda)d\lambda}{\int_{380}^{780} P_0(\lambda)V(\lambda)d\lambda} \quad (4)$$

wherein in the expression (3) or the expression (4), $I_0$ is an insect attracting index of mixed light from a reference light emitting device having a color deviation $d_{uv}$ of 0, $P_0(\lambda)$ is a spectral distribution intensity relative to the wavelength of the mixed light from the reference light emitting device having a color deviation $d_{uv}$ of 0, $S(\lambda)$ is a wavelength-related insect spectral luminous efficiency, and $V(\lambda)$ is a wavelength-related human standard spectral luminous efficiency.

3. The method for producing the light emitting device according to claim 1, wherein the first fluorescent material contains at least one fluorescent material selected from the group consisting of (1a) a rare earth aluminate fluorescent material activated with Ce, (1b) a rare earth silicon nitride fluorescent material activated with Ce, (1c) a scandate fluorescent material activated with Ce, (1d) a scandium silicate fluorescent material activated with Ce, (1e) an alkaline earth metal aluminate fluorescent material activated with Eu, and (1f) a silicate fluorescent material containing Ca, Mg and Cl and activated with Eu.

4. The method for producing the light emitting device according to claim 1, wherein the first fluorescent material contains at least one fluorescent material selected from the group consisting of a rare earth aluminate fluorescent material containing a composition represented by a following formula (I), a rare earth silicon nitride fluorescent material containing a composition represented by a following formula (II), a scandate fluorescent material containing a composition represented by a following formula (III), a scandium silicate fluorescent material containing a composition represented by a following formula (IV), an alkaline earth metal aluminate fluorescent material containing a composition represented by a following formula (V), and a silicate fluorescent material containing a composition represented by a following formula (VI),

| | |
|---|---|
| $(Lu,Y,Gd,Tb)_3(Al,Ga)_5O_{12}:Ce$ | (I) |
| $(La,Cd,Y)_3(Al,Si)_6N_{11}:Ce$ | (II) |
| $CaSc_2O_4:Ce$ | (III) |
| $Ca_3Sc_2Si_3O_{12}:Ce$ | (IV) |
| $(Sr,Ca,Ba)_4Al_{14}O_{25}:Eu$ | (V) |
| $(Ca,Sr,Ba)_8MgSi_4O_{16}(F,Cl,Br)_2:Eu$ | (VI) |

5. The method for the light emitting device according to claim 1, wherein the second fluorescent material contains at least one fluorescent material selected from the group consisting of (2a) a silicon nitride fluorescent material containing at least one element selected from Sr and Ca, and Al and activated with Eu, (2b) an alkaline earth metal silicon nitride fluorescent material activated with Eu, (2c) a fluoride fluorescent material containing at least one selected from the group consisting of K, Li, Na, Rb, Cs and $NH_4^+$, and at least one element selected from the group consisting of a Group 4 element and a Group 14 element and activated with Mn, and (2d) a fluorogermanate fluorescent material activated with Mn.

6. The method for producing the light emitting device according to claim 1, wherein the first fluorescent material contains a rare earth aluminate fluorescent material represented by $(Lu,Y,Gd,Tb)_3(Al,Ga)_5O_{12}:Ce$, and the second fluorescent material contains a silicon nitride fluorescent material represented by $(Sr,Ca)AlSiN_3:Eu$.

7. The method for producing the light emitting device according to claim 1, wherein the fluorescent member includes at least one resin selected from a silicon resin and an epoxy resin.

8. The method for producing the light emitting device according to claim 1, wherein the fluorescent member contains at least one selected from the group consisting of a filler, a light stabilizer and a colorant.

9. The method for producing the light emitting device according to claim 8, wherein the filler includes at least one selected from the group consisting of silica, barium titanate, titanium oxide and aluminum oxide.

* * * * *